US012637568B2

(12) United States Patent (10) Patent No.: US 12,637,568 B2
Yamazaki et al. (45) Date of Patent: May 26, 2026

(54) CURABLE HOT-MELT SILICONE COMPOSITION, CURED PRODUCT THEREOF, AND LAMINATE INCLUDING CURABLE HOT-MELT SILICONE COMPOSITION OR CURED PRODUCT THEREOF

(71) Applicant: DOW TORAY CO., LTD., Tokyo (JP)

(72) Inventors: Ryosuke Yamazaki, Ichihara (JP); Shinichi Yamamoto, Ichihara (JP); Kouichi Ozaki, Ichihara (JP); Toru Imaizumi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 203 days.

(21) Appl. No.: 17/912,847

(22) PCT Filed: Mar. 26, 2021

(86) PCT No.: PCT/JP2021/012840
§ 371 (c)(1),
(2) Date: Sep. 19, 2022

(87) PCT Pub. No.: WO2021/200643
PCT Pub. Date: Oct. 7, 2021

(65) Prior Publication Data
US 2023/0151215 A1 May 18, 2023

(30) Foreign Application Priority Data
Mar. 30, 2020 (JP) ................................. 2020-059292

(51) Int. Cl.
| | |
|---|---|
| *C09J 183/04* | (2006.01) |
| *C08L 83/04* | (2006.01) |
| *C09J 7/35* | (2018.01) |
| *H10H 20/854* | (2025.01) |
| *H10W 74/47* | (2026.01) |

(52) U.S. Cl.
CPC .................. *C08L 83/04* (2013.01); *C09J 7/35* (2018.01); *C09J 183/04* (2013.01); *H10H 20/854* (2025.01); *H10W 74/476* (2026.01)

(58) Field of Classification Search
CPC ...................................................... C09J 183/04
See application file for complete search history.

(56) References Cited

U.S. PATENT DOCUMENTS

| | | | | |
|---|---|---|---|---|
| 4,600,484 | A | * | 7/1986 | Drahnak .................. C08L 83/04 556/11 |
| 5,100,976 | A | | 3/1992 | Hamada et al. |
| 5,145,886 | A | | 9/1992 | Oxman et al. |
| 5,169,727 | A | | 12/1992 | Boardman |
| 5,357,007 | A | | 10/1994 | Wengrovius et al. |
| 5,392,592 | A | | 2/1995 | Bozich et al. |
| 5,668,225 | A | | 9/1997 | Okazaki et al. |
| 5,977,243 | A | | 11/1999 | Barthel et al. |
| 6,177,506 | B1 | | 1/2001 | Takahashi et al. |
| 6,376,569 | B1 | | 4/2002 | Oxman et al. |
| 6,379,792 | B1 | | 4/2002 | Isshiki et al. |
| 6,433,055 | B1 | | 8/2002 | Kleyer et al. |
| 8,124,689 | B2 | | 2/2012 | Loubert et al. |
| 8,519,063 | B2 | | 8/2013 | Taguchi et al. |
| 9,045,641 | B2 | | 6/2015 | Yoshitake et al. |
| 2002/0132891 | A1 | | 9/2002 | Azechi et al. |
| 2004/0265599 | A1 | | 12/2004 | Ushio et al. |
| 2006/0057779 | A1 | | 3/2006 | Sutoh et al. |
| 2006/0094834 | A1 | | 5/2006 | Aoki et al. |
| 2006/0270788 | A1 | | 11/2006 | Ozai et al. |
| 2008/0319144 | A1 | | 12/2008 | Morita et al. |
| 2009/0042043 | A1 | | 2/2009 | Joseph et al. |
| 2009/0075009 | A1 | | 3/2009 | Fujisawa et al. |
| 2009/0171013 | A1 | | 7/2009 | Taguchi et al. |
| 2009/0281222 | A1 | | 11/2009 | Nishiumi et al. |

(Continued)

FOREIGN PATENT DOCUMENTS

| | | |
|---|---|---|
| AU | 618818 B2 | 1/1992 |
| CN | 101151328 A | 3/2008 |

(Continued)

OTHER PUBLICATIONS

English translation of International Search Report for PCT/JP2019/042320 dated Mar. 24, 2020, 2 pages.
Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
DOWSIL™ EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.

(Continued)

*Primary Examiner* — Margaret G Moore
(74) *Attorney, Agent, or Firm* — Warner Norcross + Judd LLP

(57) ABSTRACT

Provided is a hot-melt curable silicone composition that forms a cured product that can be cured at a temperature of 100° C. or lower, has excellent storage stability, is relatively hard from curing, and has low surface tack, and a sheet or film formed from the same. The curable silicone composition comprises: (A) a solid organopolysiloxane resin that contains at a mass ratio of 0:100 to 90:10 (Al) an organopolysiloxane resin having a curing reactive functional group and containing 20 mol % or more of a Q unit (i.e., a $SiO_{4/2}$ unit), and (A2) an organopolysiloxane resin not having a curing reactive functional group and containing 20 mol % or more of a Q unit; (B) 10 to 100 parts by mass of a straight-chain or branched organopolysiloxane having a curing reactive functional group and is liquid or has plasticity; (C) an organohydrogenpolysiloxane; and (D) a photoactivated hydrosilylation reaction catalyst.

18 Claims, 1 Drawing Sheet

(56) References Cited

U.S. PATENT DOCUMENTS

| | | | |
|---|---|---|---|
| 2011/0104506 A1 | 5/2011 | Behl et al. | |
| 2011/0236666 A1 | 9/2011 | Hall et al. | |
| 2012/0139131 A1 | 6/2012 | Sugo et al. | |
| 2013/0183776 A1 | 7/2013 | Kashiwagi et al. | |
| 2013/0200554 A1 | 8/2013 | Mueller | |
| 2013/0274398 A1 | 10/2013 | Shiobara et al. | |
| 2014/0296468 A1 | 10/2014 | Kownacka et al. | |
| 2014/0377570 A1 | 12/2014 | Hirai et al. | |
| 2015/0115311 A1 | 4/2015 | Yoshida et al. | |
| 2015/0124338 A1 | 5/2015 | Mayumi et al. | |
| 2015/0183960 A1 | 7/2015 | Yamazaki et al. | |
| 2015/0315427 A1 | 11/2015 | Yoshida et al. | |
| 2015/0376482 A1 | 12/2015 | Bekemeier et al. | |
| 2016/0230005 A1 | 8/2016 | Mayumi et al. | |
| 2016/0311980 A1 | 10/2016 | Knoer | |
| 2017/0057980 A1 | 3/2017 | Boyer et al. | |
| 2017/0058103 A1 | 3/2017 | Fujisawa et al. | |
| 2017/0092822 A1 | 3/2017 | Amako et al. | |
| 2017/0166701 A1* | 6/2017 | Jo | C08G 77/38 |
| 2017/0283613 A1 | 10/2017 | Mochizuki | |
| 2017/0355804 A1 | 12/2017 | Fujisawa et al. | |
| 2018/0105692 A1 | 4/2018 | Maizumi et al. | |
| 2018/0208816 A1 | 7/2018 | Yamazaki et al. | |
| 2018/0305547 A1 | 10/2018 | Dogen et al. | |
| 2019/0169398 A1 | 6/2019 | Yamazaki | |
| 2019/0169435 A1 | 6/2019 | Yamazaki | |
| 2019/0177488 A1 | 6/2019 | Yamazaki | |
| 2019/0276684 A1 | 9/2019 | Yamazaki et al. | |
| 2019/0367744 A1 | 12/2019 | Chevalier et al. | |
| 2020/0216671 A1 | 7/2020 | Matsuzaki et al. | |
| 2020/0224069 A1 | 7/2020 | Itoh et al. | |
| 2020/0354615 A1 | 11/2020 | Itoh et al. | |
| 2020/0392335 A1 | 12/2020 | Yamazaki | |
| 2021/0162704 A1 | 6/2021 | Sreeram et al. | |
| 2021/0179783 A1 | 6/2021 | Yoshitake | |
| 2021/0179849 A1 | 6/2021 | Yoshitake | |
| 2021/0189129 A1 | 6/2021 | Yamazaki et al. | |
| 2021/0198489 A1 | 7/2021 | Yoshitake | |
| 2021/0269691 A1 | 9/2021 | Itoh et al. | |
| 2021/0284888 A1 | 9/2021 | Itoh et al. | |
| 2021/0292607 A1 | 9/2021 | Itoh et al. | |
| 2022/0002493 A1 | 1/2022 | Sugie et al. | |
| 2022/0048230 A1 | 2/2022 | Imaizumi et al. | |
| 2022/0064447 A1 | 3/2022 | Yamazaki | |
| 2022/0064491 A1 | 3/2022 | Yamazaki | |
| 2022/0089872 A1 | 3/2022 | Fukui et al. | |
| 2022/0169894 A1 | 6/2022 | Yamazaki et al. | |
| 2022/0186099 A1 | 6/2022 | Yamazaki et al. | |
| 2022/0195269 A1 | 6/2022 | Yamazaki | |
| 2022/0340756 A1 | 10/2022 | Nishijima et al. | |
| 2022/0403114 A1 | 12/2022 | Sugie et al. | |
| 2023/0044439 A1 | 2/2023 | Yamamoto et al. | |
| 2023/0137947 A1 | 5/2023 | Yamazaki et al. | |
| 2023/0151215 A1 | 5/2023 | Yamazaki et al. | |
| 2024/0002605 A1 | 1/2024 | Tanaka et al. | |
| 2024/0052106 A1 | 2/2024 | Yamazaki et al. | |
| 2024/0052220 A1 | 2/2024 | Yamamoto et al. | |

FOREIGN PATENT DOCUMENTS

| | | |
|---|---|---|
| CN | 103849149 A | 6/2014 |
| CN | 104870585 A | 8/2015 |
| CN | 106459419 A | 2/2017 |
| CN | 106715593 A | 5/2017 |
| CN | 107429062 A | 12/2017 |
| CN | 108026373 A | 5/2018 |
| CN | 109844029 A | 6/2019 |
| EP | 1002834 A1 | 5/2000 |
| EP | 3954739 A1 | 2/2022 |
| EP | 4083140 A1 | 11/2022 |
| EP | 4130157 A1 | 2/2023 |
| EP | 4269503 A1 | 11/2023 |
| JP | H0275681 A | 3/1990 |
| JP | H0625602 A | 2/1994 |
| JP | H10195085 A | 7/1998 |

| | | |
|---|---|---|
| JP | H11158379 A | 6/1999 |
| JP | H11279182 A | 10/1999 |
| JP | H11335572 A | 12/1999 |
| JP | 2000063681 A | 2/2000 |
| JP | 2000198929 A | 7/2000 |
| JP | 2001019933 A | 1/2001 |
| JP | 2002155261 A | 5/2002 |
| JP | 2003176462 A | 6/2003 |
| JP | 2003226812 A | 8/2003 |
| JP | 2004043814 A | 2/2004 |
| JP | 2004307691 A | 11/2004 |
| JP | 2004315571 A | 11/2004 |
| JP | 2005007331 A | 1/2005 |
| JP | 2006188593 A | 7/2006 |
| JP | 2006274007 A | 10/2006 |
| JP | 2007119768 A | 5/2007 |
| JP | 2007231039 A | 9/2007 |
| JP | 2009503133 A | 1/2009 |
| JP | 2009132797 A | 6/2009 |
| JP | 2009155415 A | 7/2009 |
| JP | 2010047646 A | 3/2010 |
| JP | 2010047676 A | 3/2010 |
| JP | 2010509088 A | 3/2010 |
| JP | 2011525444 A | 9/2011 |
| JP | 2012017427 A | 1/2012 |
| JP | 2013076050 A | 4/2013 |
| JP | 2013523482 A | 6/2013 |
| JP | 2013147546 A | 8/2013 |
| JP | 2013221075 A | 10/2013 |
| JP | 2013221082 A | 10/2013 |
| JP | 2013222761 A | 10/2013 |
| JP | 2013232580 A | 11/2013 |
| JP | 5385247 B2 | 1/2014 |
| JP | 2014009322 A | 1/2014 |
| JP | 2014221915 A | 11/2014 |
| JP | 2015010132 A | 1/2015 |
| JP | 2015110752 A | 6/2015 |
| JP | 2015214637 A | 12/2015 |
| JP | 2016124967 A | 7/2016 |
| JP | 2017512224 A | 5/2017 |
| JP | 2017101137 A | 6/2017 |
| JP | 2017520918 A | 7/2017 |
| JP | 2017226724 A | 12/2017 |
| JP | 2018002970 A | 1/2018 |
| JP | 2018519369 A | 7/2018 |
| JP | 2018177993 A | 11/2018 |
| JP | 2019167832 A | 10/2019 |
| JP | 2019167833 A | 10/2019 |
| JP | 2021107149 A | 7/2021 |
| JP | 2021108319 A | 7/2021 |
| TW | 201439219 A | 10/2014 |
| WO | 2006104236 A1 | 10/2006 |
| WO | 2008056810 A1 | 5/2008 |
| WO | 2013051600 A1 | 4/2013 |
| WO | 2014002918 A1 | 1/2014 |
| WO | 2014136805 A1 | 9/2014 |
| WO | 2015056483 A1 | 4/2015 |
| WO | 2015126780 A1 | 8/2015 |
| WO | 2015155949 A1 | 10/2015 |
| WO | 2016038836 A1 | 3/2016 |
| WO | 2016103654 A1 | 6/2016 |
| WO | 2016136243 A | 9/2016 |
| WO | 2016136243 A1 | 9/2016 |
| WO | 2017068762 A1 | 4/2017 |
| WO | 2018028792 A1 | 2/2018 |
| WO | 2018030286 A1 | 2/2018 |
| WO | 2018030287 A1 | 2/2018 |
| WO | 2018030288 A1 | 2/2018 |
| WO | 2018084012 A1 | 5/2018 |
| WO | 2018186161 A1 | 10/2018 |
| WO | 2018235491 A1 | 12/2018 |
| WO | 2018235492 A1 | 12/2018 |
| WO | 2019059351 A1 | 3/2019 |
| WO | 2019078140 A1 | 4/2019 |
| WO | 2019088067 A1 | 5/2019 |
| WO | 2019208756 A1 | 10/2019 |
| WO | 2020090797 A | 5/2020 |
| WO | 2020138055 A1 | 7/2020 |
| WO | 2020138409 A1 | 7/2020 |

(56)          References Cited

FOREIGN PATENT DOCUMENTS

| WO | 2020138410 A1 | 7/2020 |
|----|---------------|--------|
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.
Machine assisted English translation of JPH10195085A obtained from https://patents.google.com/patent on Jan. 22, 2025, 10 pages.
Machine assisted English translation of JP2014221915A obtained from <https://patents.google.com/patent> on Nov. 20, 2024, 17 pages.
International Search Report (with English translation) for PCT/JP2021/012840 dated Jun. 15, 2021, 6 pages.
Machine assisted English translation of CN103849149A obtained from https://worldwide.espacenet.com/patent on Jan. 22, 2024, 11 pages.
Machine assisted English translation of JPH11158379A obtained from https://worldwide.espacenet.com/patent on Nov. 9, 2023, 11 pages.
International Search Report for PCT/JP2019/051394 dated Mar. 17, 2020, 2 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
International Search Report for PCT/JP2019/051393 dated Mar. 17, 2020, 3 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012028 dated Jun. 9, 2020, 3 pages.
Machine assisted English translation of JP2013221082A obtained from https://patents.google.com/patent on Oct. 27, 2021, 14 pages.
Machine assisted English translation of JP11335572A obtained from https://patents.google.com/patent on Oct. 27, 2021, 7 pages.

Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
International Search Report for PCT/JP2020/012027 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
Machine assisted English translation of CN106715593A obtained from https://patents.google.com/patent on Mar. 14, 2023, 26 pages.
Machine assisted English translation of JP2016124967A obtained from https://patents.google.com/patent on Mar. 14, 2023, 19 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
Machine assisted English translation of WO2018235492A1 obtained from https://patents.google.com/patent on Mar. 15, 2023, 21 pages.

* cited by examiner

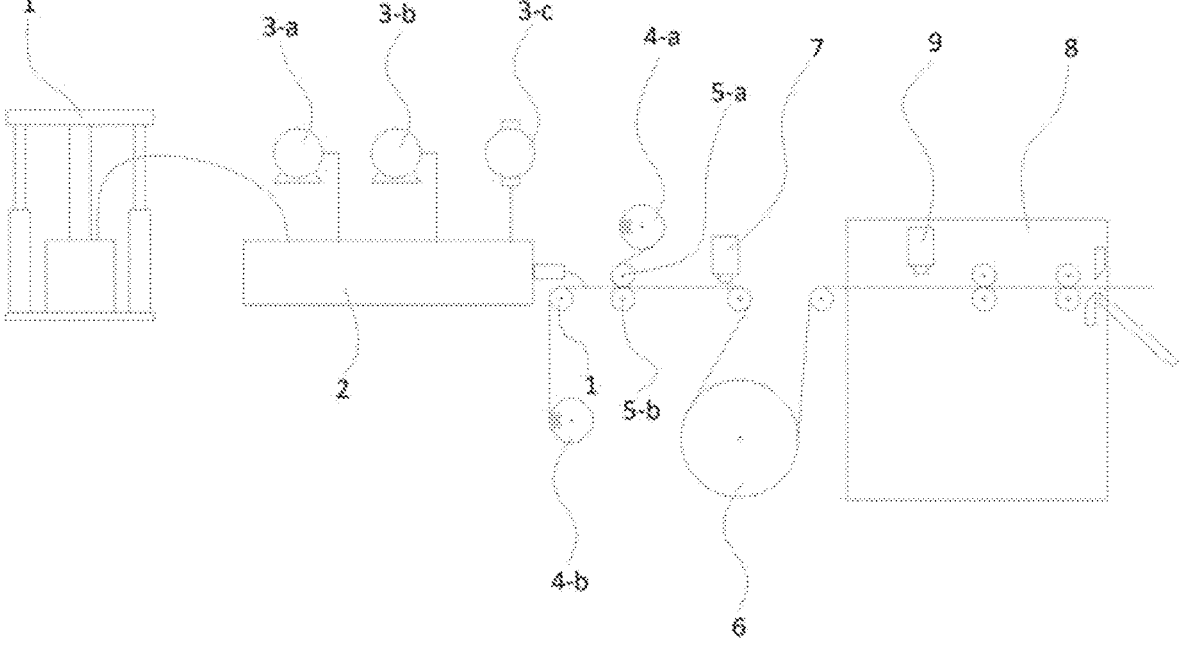

CURABLE HOT-MELT SILICONE COMPOSITION, CURED PRODUCT THEREOF, AND LAMINATE INCLUDING CURABLE HOT-MELT SILICONE COMPOSITION OR CURED PRODUCT THEREOF

CROSS-REFERENCE TO RELATED APPLICATIONS

This application is the U.S. National Stage of International Application No. PCT/JP2021/012840 filed on 26 Mar. 2021, which claims priority to and all advantages of JP Patent Application No. 2020-059292 filed on 30 Mar. 2020, the content of which is incorporated herein by reference.

TECHNICAL FIELD

The present invention relates to: a hot-melt curable silicone composition that can be cured at a low temperature of 100° C. or lower, has excellent storage stability, and forms a relatively hard cured product with low surface tack upon curing; an essentially flat curable silicone sheet or film with a thickness of 10 to 1000 μm containing the aforementioned composition and preferably not containing a void, as well as a cured product thereof; and a laminate body containing the composition or cured product. Furthermore, the present invention relates to an application of the composition or cured product (particularly including a semiconductor device or the like having a member for a semiconductor device, member for an optical semiconductor device, or other member for a semiconductor and the cured product); and a method of manufacturing the composition, a sheet or film containing the same, and a laminate body using the same.

BACKGROUND ART

Curable silicone compositions can be cured to form cured products having excellent heat resistance, cold resistance, electrical insulation, weather resistance, water repellency, and transparency, and are utilized in a wide range of industrial fields. In general, a cured product of such curable silicone compositions is less prone to discoloration compared with other organic materials and has reduced deterioration of physical properties overtime, and therefore is also suitable as a sealing agent for optical materials and semiconductor devices.

The present applicant has proposed, in Patent Document 1 and Patent Document 2, a so-called hot-melt curable granular silicone composition and a reactive silicone composition for molding. These silicone compositions are made up of so-called phenyl silicone resins, which have the advantages of superior hot-melt properties and superior hardness and strength of the cured product when compared to methyl silicone resins.

On the other hand, in recent years, optical semiconductor devices have become smaller and higher output, and when these hot-melt curable granular silicone compositions and the like are applied, especially under high temperatures of 200° C. or higher, coloring derived from phenyl silicone resin may occur, and in particular, in the field of reflective materials, light reflectance may decrease. Therefore, there is a high need for a silicone composition that satisfies the requirements for higher heat resistance and coloring resistance while achieving hot-melt properties and preferred mechanical strength for a cured product after molding.

Here, in Patent Document 3, the applicant also discloses a transparent hot-melt curable silicone sheet that uses methyl silicone resin. However, due to their nature, all components of these compositions are mixed and integrated, and thus storage stability is difficult to ensure. Therefore, there is a problem where rapid curing at a low temperature cannot be achieved and a high temperature of 150° C. or higher is essential for curing. Furthermore, these curable silicone sheets have a problem where it is difficult to produce a sheet with a film thickness of 100 μm or more using the disclosed production method.

RELATED ART DOCUMENTS

Patent Documents

Patent Document 1: International Publication WO 2016/136243 Pamphlet
Patent Document 2: Japanese Unexamined Patent Application 2014-009322
Patent Document 3: Japanese PCT Patent Application 2017-512224

SUMMARY OF THE INVENTION

Problem to be Solved by the Invention

An object of the present invention is to provide a hot-melt curable silicone composition that can be cured at low temperatures and has excellent storage stability, and a relatively hard cured product with low surface tack obtained by curing the composition. Furthermore, the present invention provides a sheet or film containing the curable silicone composition, and particularly a sheet or film that does not have a void, is substantially flat, and has a film thickness of 10 to 1000 μm, as well as a releasable laminate body including the sheet or film containing the curable silicone composition. Furthermore, yet another object of the present invention is to provide: a member for a semiconductor device including a cured product of the curable silicone composition; a semiconductor device having the cured product; and a method of molding a cured product.

Means for Solving the Problem

As a result of extensive studies, the present inventors discovered that the aforementioned problem can be solved by a curable silicone composition having hot-melt properties as a whole, containing: an organopolysiloxane that is solid at 25° C., which contains an organopolysiloxane resin having a curing reactive functional group and an organopolysiloxane resin not having a curing reactive functional group at a specific ratio (20:80 to 90:10); a straight-chain or branched-chain organopolysiloxane having at least two curing reactive functional groups in a molecule, and that is liquid or has plasticity at 25° C.; an organohydrogenpolysiloxane; and a hydrosilylation reaction catalyst that exhibits activity in the composition when irradiated with a high energy beam, thereby completing the present invention. The present composition has excellent low temperature curing properties and storage stability by using a hydrosilylation reaction catalyst that exhibits activity in the composition when irradiated with a high energy beam, and has the advantage of being able to form a relatively hard cured product with low surface tack in addition to favorable workability by using a specific combination of an organopolysiloxane resins that is solid at 25° C. and an organopolysiloxane that is liquid or has plasticity at 25° C. The composition may also contain a substantially non-volatile hydrosilylation reaction curing retarder. In addition, to achieve an organopolysiloxane resin in solid form at 25° C. in the same composition that suppresses surface tack of a cured product thereof and provides a relatively hard cured product, the mass loss ratio of the organopolysiloxane resin is more preferably 2.0 mass % or less after 1 hour of exposure at 200° C.

Note that in the present invention, atmospheric pressure refers to the atmospheric pressure in the environment where the curable silicone composition is handled in a laboratory, factory, or the like, and although not limited to a specific pressure, usually refers to an atmospheric pressure ranging from 1 atm (1013.25 hPa) to minus 100 hPa to plus 100 hPa, and particularly 1 atm (1013.25 hPa).

Furthermore, in the present specification, room temperature refers to a temperature of an environment in which a person handling the curable silicone composition of the present invention is present. Room temperature typically refers to 0° C. to 40° C., particularly refers to 15 to 30° C., and more particularly refers to 18° C. to 25° C.

The present invention also relates to a sheet or film containing the curable silicone composition described above. The sheet or film is characterized in that components constituting the curable silicone composition are melt-kneaded under a vacuum or reduced pressure within a temperature range of 50 to 150° C., and then molded into a sheet or film. Herein, in general, "sheet" refers to a sheet with a thickness of 250 μm or more, and "film" refers to a film with a thickness of 250 μm or less. However, for simplicity of description, the film and sheet may be simply collectively referred to as "sheet" in the present specification.

Effects of the Invention

The curable silicone composition of the present invention has hot-melt properties, can be cured at a low temperature triggered by irradiation with a high energy beam such as ultraviolet light or the like, have excellent storage stability, and have excellent handling workability (including control of a curing reaction) and curing properties in overmolding and the like. Furthermore, the curable silicone composition has high thixotropy at temperatures exceeding 100° C., and no liquid dripping occurs even after performing thermocompression bonding on a substrate and then performing thermosetting in an oven or the like. Furthermore, the curable silicone composition of the present invention forms a relatively hard cured product with little surface tack, and thus can be suitably used as a sealing agent for protecting a substrate. Furthermore, use is possible for double-sided adhesive applications where a relatively hard adhesive layer is required. The curable silicone composition of the present invention can be manufactured simply by a simple mixing step, and therefore can be efficiently manufactured. Furthermore, the present invention can provide such a curable silicone composition in the form of a sheet or film with a thickness of 10 to 1000 μm without a void or the like, or in the form of a releasable laminate body containing such a curable silicone composition sheet or film as well as a release sheet or film. Furthermore, the sheet or film containing the curable silicone composition of the present invention or the releasable laminate body containing the sheet or film can be used after cutting to a desired size, if necessary, in a manufacturing process or the like of an electronic component such as a semiconductor device, and can be applied to an industrial production process such as batch sealing, batch adhering, and the like to a large-area substrate.

BRIEF DESCRIPTION OF THE DRAWINGS

FIG. 1 is a schematic diagram of a twin screw extruder used in the Embodiments.

DESCRIPTION OF THE PREFERRED EMBODIMENT

Embodiments of the present invention will be described below in detail. The present invention is not limited by the following embodiments, and various types of modifications may be made within the scope of the gist of the present invention.

Curable Hot Melt Silicone Composition

The curable hot-melt silicone composition of the present invention is a thermosettable silicone composition that uses a hydrosilylation reaction, containing as main components: (component (A)) a combination of (A1) an organopolysiloxane resin containing a curing reactive functional group including a carbon-carbon double bond in the molecule and containing a siloxane unit expressed by $SiO_{4/2}$ making up at least 20 mol % of all siloxane units, that does not independently have hot-melt properties and is solid at 25° C., and (A2) an organopolysiloxane resin that does not have a curing reactive functional group containing a carbon-carbon double bond in the molecule while containing a siloxane unit expressed by $SiO_{4/2}$ making up at least 20 mol % or more of all siloxane units, that does not independently have hot-melt characteristics and is solid at 25° C., at a mass ratio of (A1):(A2)=20:80 to 90:10, preferably 35:65 to 90:10, and more preferably 50:50 to 90:10; and (component (B)) a straight or branched chain organopolysiloxane containing a carbon-carbon secondary bond, that is liquid or has plasticity at 25° C.; and also containing (component (C)) organohydrogenpolysiloxane as a cross-linking agent; and (component (D)) a hydrosilylation reaction catalyst that does not exhibit activity unless irradiated with a high energy beam but exhibits activity in the composition when irradiated with a high energy beam. In addition, in the curable hot melt silicone composition of the present invention, a hydrosilylation reaction retarder, a so-called curing retarder, may be used, but in that case, a curing retarder with a boiling point of 200° C. or higher, in particular, a boiling point of 200° C. or higher under one atmosphere of pressure (1,013.25 hPa) is preferably used. Furthermore, if the surface stickiness of the cured product to be obtained is to be reduced as much as possible depending on the application used, and if a change in modulus of elasticity of the cured product under high temperature is to be suppressed, the mass loss ratio of component (A) when exposed to 200° C. for one hour is preferably 2.0 mass % or less. The composition of the present invention uses organopolysiloxane resins with no independent hot-melt properties as components (A1) and (A2) but is further characterized in that the composition as a whole, including components (B) to (D), has hot-melt properties. Note, with the present invention, unless otherwise stated, "having hot-melt properties" means the softening point of the composition is between 50 and 200° C., the composition has melt viscosity at 150° C. (suitably, melt viscosity of less than 1,000 Pa·s), and has flowable properties. Therefore, in the present specification, the curable silicone composition having hot-melt properties of the present invention is also referred to as a curable hot-melt silicone composition.

[Significance of Integrating Components That Do Not Volatilize Readily]

The composition of the present invention is produced by using, as components of the composition, a combination of components that do not readily volatilize at about 100° C. under atmospheric pressure, and particularly at 1 atmospheric pressure (1013.25 hPa), or that have a low amount of volatile components. This is because, in the production process of the curable hot-melt silicone sheet or film of the present invention, described below, in order to obtain a sheet or film that does not contain a void and the like, it is necessary to melt and mix each component of the curable silicone composition and the composition obtained therefrom in a temperature range of 50 to 150° C. under reduced pressure. Thus, a sheet or film that does not contain a void and the like can be manufactured by using each component of the present invention. Although each component is exposed to a prescribed temperature under reduced pressure for a very short period of time, if a large amount of active component volatilizes under these mixing conditions, there is a problem where a composition with the designed properties cannot be obtained. In particular, the volatilization of a component such as a cure retarder or the like that is added in small amounts relative to the total mass of the curable silicone composition can significantly change the properties of the composition (curing properties, properties of the cured product, and the like) from an intended value. Therefore, it is preferable to use, as the optional component (E), a component of the present invention that does not volatilize readily, and particularly a component that does not substantially have volatility.

[Hot-Melt Properties and Composition of Curable Silicone Compositions]

The curable silicone composition according to the present invention has hot-melt properties as a whole and can flow under heated conditions. In particular, the curable silicone composition of the present invention preferably has a softening point of 50° C. or higher and melt viscosity at 150° C. (preferably, a melt viscosity that is less than 1,000 Pa-s). Note that in the present invention, the composition as a whole only needs have hot-melt properties, and individual components forming the composition do not need to have hot-melt properties.

More specifically, the curable silicone composition according to the present invention, in other words, the curable hot-melt silicone composition, contains the following components (A), (B), (C), and (D) as essential components in the following proportions, and exhibits hot-melt properties as a whole.

(A) 100 mass parts of an organopolysiloxane resin containing the following component (A1) and component (A2) at a mass ratio of 20:80 to 90:10, preferably 35:65 to 90:10, and more preferably 50:50 to 90:10

(A1) an organopolysiloxane resin that is solid at 25° C., having a curing reactive functional group containing a carbon-carbon double bond in a molecule, containing at least 20 mol % or more of a siloxane unit as expressed by $SiO_{4/2}$ of all siloxane units, and not having hot-melt properties alone, and (A2) an organopolysiloxane resin that is solid at 25° C., not having a curing reactive functional group containing a carbon-carbon double bond in a molecule, containing at least 20 mol % or more of a siloxane unit as expressed by $SiO_{4/2}$ of all siloxane units, and not having hot-melt properties alone;

(B) 10 to 100 mass parts of a straight chain or branched organopolysiloxane that is liquid or has plasticity at 25° C., having a curing reactive functional group containing at least two carbon-carbon double bonds in a molecule;

(C) an organohydrogenpolysiloxane having at least two silicon-bonded hydrogen atoms in a molecule (at an amount where the number of hydrogen atoms bonded to a silicon atom per one alkenyl group bonded to a silicon atom included in the entire composition is 0.5 to 20.0); and (D) a hydrosilylation reaction catalyst that does not exhibit activity without irradiating with a high energy beam, but exhibits activity in a composition by irradiating a high energy beam, at an amount sufficient for curing the present composition.

Furthermore, the curable silicone composition above may contain the following component (E) as an optional component:

(E) Curing retarder for a hydrosilylation reaction with a boiling point of 200° C. or higher under atmospheric pressure, particularly at 1 atm.

Furthermore, the curable hot-melt silicone composition of the present invention may have other additives known in the art, added within a scope where the properties intended by the present invention can be maintained.

Note that the shape of the curable hot-melt silicone composition of the present invention is not particularly limited, but may be, for example, in a form molded into a sheet or film, with the sheet or film form being particularly preferred. Components and optional components included in the composition of the present invention will be described below.

(Component (A))

The curable silicone composition according to the present invention has, as component (A), a combination of an organopolysiloxane resin that is solid at 25° C., having a curing reactive functional group that contains a carbon-carbon double bond, containing a siloxane unit expressed by $SiO_{4/2}$ making up at least 20 mol % or more of all siloxane units, and not exhibiting hot-melt properties alone, and an organopolysiloxane resin that is a solid at 25° C., not having a curing reactive functional group that contains a carbon-carbon double bond, containing a siloxane unit expressed by $SiO_{4/2}$ making up at least 20 mol % or more of all siloxane units, and not exhibiting hot-melt properties alone, at a mass ratio of 20:80 to 90:10, preferably 35:65 to 90:10, and more preferably 50:50 to 90:10. The organopolysiloxane resin may further contain a siloxane unit expressed by $R_3SiO_{1/2}$, $R_2SiO_{2/2}$, or $RSiO_{3/2}$ (R represents a monovalent organic group, and particularly a monovalent hydrocarbon group with 1 to 10 carbon atoms), or a hydroxyl group, or an alkoxy group expressed by $R^2O_{1/2}$ ($R^2$ represents a hydrogen atom or an alkyl group having 1 to 10 carbon atoms), but preferably includes siloxane units expressed by $SiO_{4/2}$ making up at least 20 mol % or more, preferably 40 mol % or more, and particularly preferably within a range of 40 to 90 mol % of all siloxane units. If the amount of the siloxane units expressed by $SiO_{4/2}$ is less than 20 mol %, a technical effect of the present invention may not be achieved even if the organopolysiloxane resin contains a large amount of other branched siloxane units (for example, RSiO$_{3/2}$), for example.

The organopolysiloxane resin of component (A) is preferably an organopolysiloxane resin mixture containing (A1) an organopolysiloxane resin that is solid at 25° C., having a curing reactive functional group containing a carbon-carbon double bond in a molecule, containing a siloxane unit as expressed by SiO$_{4/2}$ making up at least 20 mol % or more of all siloxane units, and not having hot-melt properties alone, and (A2) an organopolysiloxane resin that is solid at 25° C., not having a curing reactive functional group containing a carbon-carbon double bond in a molecule, containing a siloxane unit as expressed by SiO$_{4/2}$ making up at least 20 mol % or more of all siloxane units, and not having hot-melt properties alone, at a mass ratio of 20:80 to 90:10, preferably 35:65 to 90:10, and more preferably 50:50 to 90:10 (component (A1):component (A2)).

Note that the curing reactivity means that the composition is able to react with an organohydrogensiloxane of component (C) by a hydrosilylation reaction, and thereby the entire composition can be cured.

Although component (A) described above does not have hot-melt properties alone, the composition of the present invention can have hot-melt properties as a whole by using component (A) in combination with component (B) described later in a prescribed quantitative ratio range.

[Organopolysiloxane Resin (A1) Having a Curing Reactive Functional Group]

Component (A1) described above is one base compound of the present composition, and is an organopolysiloxane resin that contains a siloxane unit expressed by SiO$_{4/2}$ making up at least 20 mol % or more of all siloxane units, has no hot-melt properties alone, and has a curing reactive functional group containing a carbon-carbon double bond in a molecule.

Component (A1) must have a curing reactive group having a carbon-carbon double bond in a molecule. Such a curing reactive group is a hydrosilylation reactive functional group, which can form a cured product by a hydrosilylation cross-linking reaction with component (C). Such a curing reactive group is particularly preferably an alkenyl group, and more particularly preferably a vinyl group or hexenyl group.

Component (A1) is an organopolysiloxane resin that independently does not have hot-melt properties and is solid in a solvent-free state. Herein, the absence of hot-melt properties means that the organopolysiloxane resin, which is component (A1), does not exhibit heating and melting behavior independently at 200° C. or lower, and specifically means that the component does not have a softening point or melt viscosity at a temperature of 200° C. or lower. In order to exhibit such properties, the component (A1) has a functional group in the organopolysiloxane resin that is a functional group selected from monovalent hydrocarbon groups with 1 to 10 carbon atoms, and particularly methyl groups and other alkyl groups with 1 to 10 carbon atoms, and does not substantially contain a phenyl group or other aryl group. For example, the ratio of aryl groups in all organic groups bonded to silicon atoms is preferably 5 mol % or less, and more preferably 2 mol % or less. It is particularly preferable that no aryl groups are included at all. If component (A1) contains a large amount of a phenyl group or other aryl group as an organic group, the component may become independently hot-meltable and the characteristic effect of reinforcing the cured product of SiO$_{4/2}$ groups may be reduced.

Preferably, a functional group bonded to a silicon atom in the organopolysiloxane resin of component (A1) is a group selected from a methyl group, a vinyl group, or other alkenyl group. It is preferable that 70 to 99 mol % of all organic groups bonded to silicon atoms are methyl groups, it is more preferable that 80 to 99 mol % of all organic groups bonded to silicon atoms are methyl groups, and it is particularly preferable that 88 to 99 mol % of all organic groups bonded to silicon atoms are methyl groups. Other organic groups bonded to a silicon atom are particularly preferably a vinyl group or other alkenyl group. In such a range, component (A1) is not hot-meltable alone, but is useful as a component that is particularly excellent in coloring resistance and the like at the high temperatures of a cured product obtained from the curable silicone composition of the present invention. Note that the organopolysiloxane resin of component (A1) may contain a small amount of a hydroxyl group or alkoxy group.

Component (A1) is an organopolysiloxane resin that is solid in a solvent-free state, and contains a siloxane unit expressed by SiO$_{4/2}$ making up at least 20 mol % or more of all siloxane units in a molecule. Preferably, the SiO$_{4/2}$ unit is at least 40 mol %, more preferably 50 mol % or more, and particularly preferably within a range of 50 to 90 mol % of all siloxane units. Furthermore, an organic group R provided by the organopolysiloxane resin of component (A1) is a monovalent organic group, preferably a functional group selected from monovalent hydrocarbon groups having 1 to 10 carbon atoms, and particularly alkyl groups having 1 to 10 carbon atoms, such as methyl groups and the like, and alkenyl groups, and from the perspective of technical effectiveness, group R preferably does not substantially contain a phenyl group or other aryl group, as described above.

Preferably, component (A1) is (A1-1) an organopolysiloxane resin that is a solid at 25° C., not having hot-melt properties alone, expressed by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

(where each R$^1$ independently represents a monovalent hydrocarbon group with 1 to 10 carbon atoms, but 1 to 12 mol % of all R$^1$s in a molecule represents an alkenyl group; each R$^2$ represents a hydrogen atom or an alkyl group with 1 to 10 carbon atoms; and a, b, c, d, and e represent numbers that satisfy $0.10 \leq a \leq 0.60$, $0 \leq b \leq 0.70$, $0 \leq c \leq 0.80$, $0 \leq d \leq 0.65$, $0 \leq e \leq 0.05$, but $c+d>0.20$ and $a+b+c+d=1$).

In the aforementioned average unit formula, each R1 independently represents a monovalent hydrocarbon group having 1 to 10 carbon atoms. Examples include groups selected from a group consisting of methyl and other alkyl groups; vinyl groups, 1-hexenyl groups, and other alkenyl groups; phenyl groups and other aryl groups; and aralkyl groups. Furthermore, 1 to 12 mol % of all R$^1$s in one molecule is an alkenyl group, preferably 2 to 10 mol % of all R$^1$s in one molecule is an alkenyl group, and particularly preferably a vinyl group. If the alkenyl group content is less than the lower limit of the range described above, the mechanical strength (hardness, and the like) of the resulting cured product may be insufficient. On the other hand, if the amount of the alkenyl group is at or below the upper limit of the range described above, the composition containing the component can achieve favorable hot-melt performance as an entire composition. Note that each $R^1$ preferably represents a functional group selected from methyl groups and other alkyl groups having 1 to 10 carbon atoms, and vinyl groups, hexenyl groups and other alkenyl groups, and from the perspective of a technical effect of the present invention, the $R^1$ preferably does not substantially contain a phenyl group or other aryl group. If a large amount of phenyl groups or other aryl groups are included, component (A) itself may have hot-melt properties, the technical effect of the present invention may not be achieved, and in the cured product, an effect of reinforcing the cured product peculiar to $SiO_{4/2}$ groups may be reduced.

In the formula above, $R^2$ is an alkyl group having a hydrogen atom or 1 to 10 carbon atoms. Examples of alkyl groups in $R^2$ include methyl and the like. The group $R^2O_{1/2}$ containing the $R^2$ corresponds to a hydroxyl group or alkoxy group of the organopolysiloxane resin of component (A).

In the formula, "a" is a number indicating the percentage of siloxane units in the general formula: $R^1{}_3SiO_{1/2}$. "a" satisfies 0.1 a 0.60, and preferably satisfies 0.15 a 0.55. If "a" is at or above the lower limit of the aforementioned range, the composition containing the component can achieve favorable hot-melt performance as a whole composition. On the other hand, if "a" is less than or equal to the upper limit of the aforementioned range, the mechanical strength (hardness, elongation rate, and the like) of the cured product obtained by curing the curable silicone composition of the present invention is not too low.

In the formula, "b" is a number indicating the percentage of siloxane units in the general formula: $R^1{}_2SiO_{2/2}$. "b" satisfies 0 b 0.70, and preferably satisfies $0 \le b \le 0.60$. If "b" is less than or equal to the upper limit of the aforementioned range, the composition containing the component can achieve favorable hot-melt performance as a whole composition and a composition with little stickiness at room temperature can be obtained.

In the formula, "c" is a number indicating the percentage of siloxane units in the general formula: $R^3SiO_{3/2}$. "c" satisfies $0 \le c \le 0.80$, and preferably satisfies $0 \le c \le 0.75$. If "c" is less than or equal to the upper limit of the aforementioned range, the composition containing the component can achieve favorable hot-melt performance as a whole composition and a low-tack or tack-free composition with little stickiness at room temperature can be obtained. In the present invention, "c" may be 0 and is preferably 0.

In the formula above, "d" is a number indicating the ratio of siloxane units of formula $SiO_{4/2}$, and must satisfy $0.00 \le d \le 0.65$, preferably satisfies $0.20 \le d \le 0.65$, and particularly preferably satisfies $0.25 \le d \le 0.65$. If "d" is within the aforementioned numerical value range, the composition containing this component can achieve favorable hot-melt performance as a whole composition, and a cured product obtained by curing the composition can be relatively hard and have sufficient flexibility for practical use.

In the present invention, "c" or "d" in the aforementioned formula may be 0, but must satisfy c+d>0.20. If the value of c+d is 0.20 or less, favorable hot-melt performance cannot be achieved for the composition as a whole, and a technical effect of the present invention may not be sufficiently achieved.

In the formula above, "e" is a number indicating the percentage of units in the general formula: $R^2O_{1/2}$, where the units are a hydroxyl group or alkoxy group bonded to a silicon atom that can be contained in the organopolysiloxane resin. "e" satisfies $0 \le e \le 0.05$, preferably $0 \le e \le 0.03$. If "e" is below the upper limit of the range, a material that achieves favorable hot-melt performance as an entire composition can be obtained. Note that in the formula above, the sum of "a", "b", "c" and "d", which is the sum of each siloxane unit, is equal to 1.

Component (A1) is an organopolysiloxane resin having the above characteristic and that is solid at room temperature, and thus, in order to physically mix with component (B) described below, is preferably used in a condition dissolved in a solvent or solvent mixture selected from a group consisting of aromatic hydrocarbons; ethers; silicones; esters; ketones; and the like. The solvent used herein can be efficiently removed in a process described below.

[Component (A2)]

Component (A2) is one base compound of the present composition, is an organopolysiloxane resin that is solid at 25° C., not having hot-melt properties alone and not containing a curing reactive functional group, and is a component for achieving hot-melt properties of the curable silicone composition as a whole and excellent stress relaxation properties of a cured product obtained by curing the curable silicone composition through use in combination with component (A1) and component (B) described above within a prescribed quantitative range.

Component (A2) is an organopolysiloxane resin that independently does not have hot-melt properties and is solid in a solvent-free state. Herein, the absence of hot-melt properties means that the organopolysiloxane resin, which is component (A2), does not exhibit heating and melting behavior independently at 200° C. or lower, and specifically means that the component does not have a softening point or melt viscosity at a temperature of 200° C. or lower. In order to exhibit such properties, the component (A2) has a functional group in the organopolysiloxane resin that is a functional group selected from monovalent hydrocarbon groups with 1 to 10 carbon atoms, and particularly methyl groups and other alkyl groups with 1 to 10 carbon atoms, and does not substantially contain a phenyl group or other aryl group. For example, the ratio of aryl groups in all organic groups bonded to silicon atoms is preferably 5 mol % or less, and more preferably 2 mol % or less. It is particularly preferable that no aryl groups are included at all. If component (A2) contains a large amount of a phenyl group or other aryl group as an organic group, the component may become hot-meltable and the characteristic effect of reinforcing the cured product of $SiO_{4/2}$ groups may be reduced.

Component (A2) is an organopolysiloxane resin which, similar to component (A1), is a solid at 25° C. and contains a siloxane unit expressed by $SiO_{4/2}$ making up at least 20 mol % or more of all siloxane units, but does not have a curing reactive functional group containing at least one carbon-carbon double bond in a molecule. In other words, component (A2) does not contain an alkenyl group such as a vinyl group or the like as a functional group in the organopolysiloxane resin. Examples of groups provided by the organopolysiloxane resin of component (A2) include monovalent hydrocarbon groups with 1 to 10 carbon atoms, and particularly methyl groups and other alkyl groups with 1 to 10 carbon atoms. The organopolysiloxane resin must be substantially free of phenyl groups or other aryl groups. For example, the ratio of aryl groups in all organic groups bonded to silicon atoms is 5 mol % or less, and more preferably 2 mol % or less. It is particularly preferable that no aryl groups are included at all.

The functional group bonded to the silicon atom in component (A2) is suitably a methyl group or other alkyl group with 1 to 10 carbon atoms, and 70 mol % to 100 mol % of the organic group bonded to all the silicon atoms is preferably a methyl group. 80 mol % to 100 mol % is more preferably a methyl group, and 88 mol % to 100 mol % is particularly preferably a methyl group. Within this range, component (A2) can be a component that does not individually exhibit hot-melt properties, and that is particularly effective in reinforcing a cured product containing siloxane units expressed by $SiO_{4/2}$. Note that the organopolysiloxane resin of component (A2) may contain a small amount of a hydroxyl group or alkoxy group.

Component (A2) does not have a curing reactive functional group having a carbon-carbon double bond in a molecule, and thus independently does not form a cured product when combined with organohydrogenpolysiloxane, which is component (C), but improves the hot-melt properties of the curable silicone composition of the present invention and has a reinforcing effect with regard to cured product obtained by curing the curable silicone composition. Furthermore, the hot-melt properties of the resulting curable silicone composition and the physical properties of the composition after curing can be adjusted, if necessary, by using component (A1) having a curing reactive functional group.

Component (A2) is an organopolysiloxane resin that is solid at 25° C. in a solvent-free state, and contains a siloxane unit expressed by $SiO_{4/2}$ making up at least 20 mol % of all siloxane units, which is a branched siloxane unit, in the molecule. Preferably, the $SiO_{4/2}$ unit of the organopolysiloxane of component (A2) is at least 40 mol %, more preferably 50 mol % or more, and particularly preferably within a range of 50 to 65 mol % of all siloxane units.

Preferably, the component (A2) is (A2-1) an organopolysiloxane resin that does not have hot-melt properties alone, expressed by the following average unit formula:

$$(R^3{}_3SiO_{1/2})_f(R^3{}_2SiO_{2/2})_g(R^3SiO_{3/2})_h(SiO_{4/2})_i(R^2O_{1/2})_j$$

(where each $R^3$ independently represents a monovalent hydrocarbon group with 1 to 10 carbon atoms and that does not contain a carbon-carbon double bond; $R^2$ represents a hydrogen atom or an alkyl group with 1 to 10 carbon atoms; and f, g, h, i, and j represents numbers that satisfy $0.35 \le f \le 0.55$, $0 \le g \le 0.20$, $0 \le h \le 0.20$, $0.45 \le i \le 0.65$, $0 \le j \le 0.05$, and $f+g+h+i=1$).

In the average unit formula above, each R3 independently represents a monovalent hydrocarbon group having 1 to 10 carbon atoms and containing no carbon-carbon double bond. Examples includes groups selected from a group consisting of methyl and other alkyl groups; phenyl and other aryl groups; and benzyl and other aralkyl groups. Herein, 70 mol % or more of all R3 in one molecule are preferably a methyl group or other alkyl group having 1 to 10 carbon atoms, with a methyl group being particularly preferable, and it is particularly preferable that 88 mol % or more are an alkyl group having 1 to 10 carbon atoms, and particularly a methyl group, from the perspective of industrial production and the technical effect of the invention. On the other hand, $R^3$ is preferably substantially free of phenyl groups and other aryl groups. If a large amount of phenyl groups or other aryl groups are included, component (A2) itself may have hot-melt properties, the technical effect of the present invention may not be achieved, and the coloring resistance under high temperatures of a cured product obtained by curing the curable silicone composition of the present invention may deteriorate.

In the formula above, $R^2$ is as described above, but when $R^2$ represents an alkyl group, an example of an alkyl group is a methyl group.

In the formula, "f" is a number indicating the percentage of siloxane units of the general formula: $R^3{}_3SiO_{1/2}$. "f"

satisfies $0.35 \le f \le 0.55$, and preferably $0.40 \le f \le 0.50$. If "f" is at or above the lower limit of the aforementioned range, the curable silicone composition containing the component can achieve favorable hot-melt performance as a whole composition. On the other hand, if "f" is less than or equal to the upper limit of the aforementioned range, the mechanical strength (hardness, and the like) of the cured product obtained is not too low.

In the formula, "g" is a number indicating the percentage of siloxane units in the general formula: $R^1{}_2SiO_{2/2}$. "g" satisfies $0 \le g \le 0.20$, and preferably $0 \le g \le 0.10$. If "g" is less than or equal to the upper limit of the range, the curable silicone composition containing the component can achieve favorable hot-melt performance as a whole composition and a composition with little stickiness at room temperature can be obtained. In the present invention, "g" may be 0 and is preferably 0.

In the formula, "h" is a number indicating the percentage of siloxane units in the general formula: $R^1SiO_{3/2}$. "h" satisfies $0 \le h \le 0.20$, and preferably $0 \le h \le 0.10$. If "h" is less than or equal to the upper limit of the range, the curable silicone composition containing the component can achieve favorable hot-melt performance as a whole composition and a composition with little stickiness at room temperature can be obtained. In the present invention, "h" may be 0 and is preferably 0.

In the formula above, "i" is the number indicating the percentage of $SiO_{4/2}$ siloxane units, and must satisfy $0.45 \le i \le 0.65$, and particularly preferably satisfies $0.50 \le i \le 0.65$. When "i" is within the numerical value range, the curable silicone composition containing this component can achieve favorable hot-melt performance as a whole composition, and thus a composition can be achieved, which has excellent mechanical strength of a cured product obtained by curing the curable silicone composition, has no stickiness as a whole composition, and has favorable handling workability.

In the formula above, "i" is a number indicating the percentage of units of the general formula: $R^2O_{1/2}$, where the units are a hydroxyl group or alkoxy group bonded to a silicon atom that can be contained in the organopolysiloxane resin. "j" satisfies $0 \le j \le 0.05$, preferably $0 \le j \le 0.03$. If "j" is at or below the upper limit of the aforementioned range, the curable silicone composition as a whole can achieve a favorable hot-melt performance. Note that in the formula above, the sum of "f", "g", "h" and "i", which is the sum of each siloxane unit, is equal to 1.

Component (A2) is an organopolysiloxane resin having the aforementioned characteristics, and is similar to the aforementioned component (A1) in terms of handling properties. In other words, component (A2) is solid at room temperature (for example, 25° C.), and thus, like component (A1), can be used dissolved in the solvent or solvent mixture described above in order to mix with component (B). Thereafter, the solvent can be removed to prepare a curable silicone composition.

[Removal of Volatile Low Molecular Weight Components in Component (A)]

For component (A1) and the component (A2), volatile low molecular weight components are produced in each production process. The volatile low molecular weight component is specifically a structure of $M_4Q$. Thus, in order to apply the curable silicone composition of the present invention to an application laminated with a base material of a semiconductor or the like, the $M_4Q$ structure is preferably removed from the organopolysiloxane resin prior to a molding step of laminating with a base material and then curing the curable silicone composition, and, if possible, prior to preparing the curable silicone composition. Examples of methods of removing the $M_4Q$ structure from the organopolysiloxane resin include methods of obtaining a particulate organopolysiloxane resin in a manufacturing process of the organopolysiloxane resin, which is then dried in an oven or the like to remove the $M_4Q$ structure, methods of removing the structure along with the aforementioned organic solvent in a twin-screw kneader described later, and the like.

[Mass Ratio of Component (A1) and Component (A2) in Component (A)]

In order for the present composition as a whole to have hot-melt properties, component (A2) or a mixture of component (A1) and component (A2) must be mixed together with component (B), described below, at a prescribed ratio. The ratio of component (A1) and component (A2) may be within a range of 20:80 to 90:10, is preferably within a range of 35:65 to 90:10, and more preferably 50:50 to 90:10. Component (A2) itself does not have curing properties due to not having a curing reactive functional group. However, by using component (A2) in combination with component (A1) in the present composition, it is possible to adjust to a certain degree the storage elastic modulus, loss elastic modulus, and tan δ calculated from the ratio therefrom, thereby achieving an elastic modulus, flexibility, and stress relaxation properties that are suitable for a cured product. Furthermore, a curable hot-melt silicone composition with desired properties in the present invention can be prepared by combining component (A2) with component (B) without component (A1).

(Component (B))

Component (B) is one base compound of the present curable silicone composition, is a straight-chain or branched-chain organopolysiloxane that is liquid or has plasticity at 25° C., and has a curing reactive functional group containing at least two carbon-carbon double bonds in a molecule. Such a curing reactive chain organopolysiloxane, when mixed with the solid organopolysiloxane resin of component (A) described above, can exhibit hot-melt properties as an entire composition.

Component (B) must have a curing reactive functional group having a carbon-carbon double bond in a molecule. Such a curing reactive functional group is hydrosilylation reactive, and forms a cured product by a cross-linking reaction with another component. Such a curing reactive functional group is an alkenyl group, and preferably a vinyl group or hexenyl group, similar to that provided by component (A1).

Component (B) is a straight-chain or branched-chain organopolysiloxane that is liquid or has plasticity at 25° C. (room temperature), and when mixed with component (A1) in a solid state at room temperature, the composition as a whole can exhibit hot-melt properties. A chemical structure of the organopolysiloxane of component (B) may be a straight chain organopolysiloxane, or a branched-chain organopolysiloxane having a small number of branched siloxane units (for example, a T unit expressed by general formula: $R^4SiO_{3/2}$ (where $R^4$ independently represents a monovalent hydrocarbon group with 1 to 10 carbon atoms) or a Q unit expressed by $SiO_{4/2}$), but is preferably (B1) a straight-chain diorganopolysiloxane expressed by the following structural formula:

$$R^4{}_3SiO(SiR^4{}_2O)_kSiR^4{}_3$$

(where each $R^4$ independently represents a monovalent hydrocarbon group with 1 to 10 carbon atoms, but at least two of the $R^4$s in one molecule represents an alkenyl group, and k represents a number from 20 to 5,000).

A straight-chain diorganopolysiloxane having an alkenyl group, and particularly preferably a vinyl group at both ends of a molecular chain is preferred.

In the formula above, each $R^4$ independently represents a monovalent hydrocarbon group having 1 to 10 carbon atoms, and examples thereof include the same groups as above. Furthermore, at least two of the $R^4$ in one molecule are alkenyl groups, and preferably a vinyl group. Furthermore, each $R^4$ is preferably a functional group selected from a group consisting of methyl groups and other alkyl groups having 1 to 10 carbon atoms and vinyl groups, hexenyl group and other alkenyl groups, and it is preferable that of all $R^4$s, at least two are alkenyl groups per molecule, and the remaining $R^4$ are methyl groups. Note that from the viewpoint of a technical effect of the invention, $R^4$ is preferably substantially free of an aryl group such as a phenyl group or the like. If a large amount of phenyl groups or other aryl groups are included, the coloring resistance at high temperatures of the cured product obtained from the curable silicone composition may deteriorate. Particularly preferably, a vinyl group or other alkenyl group is preferred at both ends of a molecular chain, with the rest of $R^4$ being a methyl group.

In the formula above, k represents a number between 20 and 5,000, preferably between 30 and 3,000, and particularly preferably between 45 and 800. If k is at or above the lower limit of the aforementioned range, a curable silicone composition having little stickiness at room temperature can be obtained. On the other hand, if k is at or below the upper limit of the aforementioned range, the curable silicone composition as a whole can achieve a favorable hot-melt performance.

Herein, in order to exhibit hot-melt properties as an entire composition, component (B), which is a straight-chain or branched-chain organopolysiloxane, relative to 100 mass parts of component (A), which is an organopolysiloxane resin, is within a range of 10 to 100 mass parts, is preferably within a range of 10 to 70 mass parts, and is more preferably within a range of 15 to 50 mass parts. If the amount of component (B) is within the aforementioned range, the resulting curable silicone composition exhibits favorable hot-melt properties, the mechanical strength of a cured product obtained by curing the curable silicone composition can be increased, and the stickiness of the resulting cured silicone composition at room temperature can be reduced, thereby improving the handling workability of the composition.

(Component (C))

Component (C) is an organohydrogenpolysiloxane having at least two silicon atom-bonded hydrogen atoms in one molecule that can be cross-linked with the carbon-carbon double bond in component (A) and component (B) above in the presence of a hydrosilylation-reaction catalyst, and is a component that cures the composition.

The structure of the crosslinking agent, organohydrogenpolysiloxane, is not particularly limited and may be straight-chain, branched-chain, cyclic, or resinous. In other words, component (C) may be an organohydrogenpolysiloxane having a hydrogen organosiloxy unit expressed by $HR_2SiO_{1/2}$ ($M^H$ unit, where R independently represents a monovalent organic group), or a hydrogen organosiloxy unit expressed by $HRSiO^{2/2}$ (DH unit, where R independently represents a monovalent organic group).

On the other hand, when the curable silicone composition is used in a molding process, since the content of the curable reactive functional group containing a carbon-carbon double bond in the composition is small, from the viewpoint of curing speed, moldability, and curing properties thereof, the organohydrogenpolysiloxane contains a monoorganosiloxy unit represented by $RSIO_{3/2}$ (T unit, wherein R is a monovalent organic group or a silicon-bonded hydrogen atom) or a siloxy unit (Q unit) represented by $SiO_{4/2}$, and at least two hydrogen diorganosiloxy units represented by $HR_2SiO_{1/2}$ ($M^H$ unit, where R is independently a monovalent organic group), and the organohydrogenpolysiloxane resin having the $M^H$ unit at the molecular terminal is preferred.

A particularly preferred organohydrogenpolysiloxane is an organohydrogenpolysiloxane expressed by the following average composition formula (1):

$$(R^4{}_3SiO_{1/2})_a(R^5{}_2SiO_{2/2})_b(R^5SiO_{3/2})_c(SiO_{4/2})_d \\ (R^2O_{1/2})_e \qquad (1)$$

(Where $R^4$ independently represents an unsubstituted or substituted monovalent hydrocarbon group that does not contain a hydrogen atom or an aliphatic unsaturated bond with 1 to 12 carbon atoms, $R^5$ independently represents an unsubstituted or substituted monovalent hydrocarbon group containing an aliphatic unsaturated bond with 1 to 12 carbon atoms, at least two of all $R^4$s represent hydrogen atoms, and a, b, c, and d represents numbers that satisfy conditions of $0.01{\le}a{\le}0.6$, $0{\le}b$, $0{\le}c{\le}0.9$, $0{\le}d{\le}0.9$, and a+b+c+d=1 and c+d 0.2).

Note that the organohydrogenpolysiloxane may optionally have a mass loss ratio relative to pre-exposure of 10% or less after exposure to 100° C. for 1 hour under atmospheric pressure.

In the formula above, each $R^4$ represent the same or different hydrogen atom or monovalent hydrocarbon group with 1 to 12 carbon atoms without an aliphatic unsaturated carbon bond. However, at least two, and preferably at least three $R^4$s in one molecule are hydrogen atoms. From an industrial perspective, other than a hydrogen atom, the monovalent hydrocarbon group R4 is preferably a methyl group or a phenyl group.

In the formula, $R^5$ represents a monovalent hydrocarbon group with 1 to 12 carbon atoms without an aliphatic unsaturated carbon bond, and examples include the same groups as the monovalent hydrocarbon group of $R^4$ described above. $R^5$ is preferably a group selected from methyl groups and phenyl groups.

In the formula, "a", "b", "c", and "d" are numbers satisfying the following conditions: $0.01{\le}a{\le}0.6$; $0{\le}b$; $0{\le}c{\le}0.9$; $0{\le}d{\le}0.9$; a+b+c+d=1; and c+d 0.2. Specific examples include $M^H$MT resins, $M^H$T resins, $M^H$MTQ resins, $M^H$MTQ resins, $M^H$DQ resin, $M^H$Q resins, and the like. In the notation of the resin above, M, D, T, and Q represent a M unit, D unit, T unit, and Q unit, respectively, and $M^H$ represents an M unit with a hydrogen atom.

In the formula (1) above, $R^2$ is an alkyl group having a hydrogen atom or 1 to 10 carbon atoms. Examples of alkyl groups in $R^2$ include methyl groups and the like. The group $R^2O_{1/2}$ containing the $R^2$ corresponds to a hydroxyl group or alkoxy group of the organohydrogenpolysiloxane of component (C).

In the formula above, "e" is a number indicating the percentage of units in the general formula: $R^2O_{1/2}$, where the units are a hydroxyl group or alkoxy group bonded to a silicon atom that can be contained in the organopolysiloxane resin. "e" satisfies $0{\le}j{\le}0.05$, preferably $0{\le}j{\le}0.03$ [sic]. Note that in the formula (1) above as described above, the sum of "a", "b", "c" and "d", which is the sum of each siloxane unit, is equal to 1.

Component (C) is preferably an organohydrogenpolysiloxane expressed by the following average compositional formula (2):

$$(HR^6{}_2SiO_{1/2})_e(R^6{}_2SiO_{2/2})_f(SiO_{4/2})_g \qquad (2)$$

In formula (2), $R^6$ independently represents an unsubstituted or substituted monovalent hydrocarbon group that does not contain an aliphatic unsaturated bond with 1 to 12 carbon atoms, and "e", "f", and "g" represent numbers that satisfy conditions of $0.01{\le}e{\le}0.6$, $0{\le}f{\le}0.9$, $0.2{\le}g{\le}0.9$, and e+f+g=1.

Specific examples of the monovalent hydrocarbon group include the same as those indicated as specific examples of the monovalent hydrocarbon group expressed by $R^4$ in average compositional formula (1) above. $R^6$ preferably independently represents a group selected from methyl groups and phenyl groups.

Furthermore, component (C) is preferably an organohydrogenpolysiloxane expressed by the following average compositional formula (3):

$$(HR^7{}_2SiO^{1/2})_h(R7_2SiO_{2/2})_i(R^8SiO_{3/2})_j \qquad (3)$$

In formula (3), $R^7$ and $R^8$ each independently represent an unsubstituted or substituted monovalent hydrocarbon group that does not contain an aliphatic unsaturated bond with 1 to 12 carbon atoms, at least 10 mol % of all $R^8$s represent aryl groups, and "h", "l", and "j" represent numbers that satisfy conditions of $0.01{\le}h{\le}0.6$, $0{\le}i{\le}0.9$, $0.2{\le}j{\le}0.9$, and h+i+j=1.

Specific examples of the monovalent hydrocarbon group include the same as those indicated as specific examples of the monovalent hydrocarbon group expressed by $R^4$ in average compositional formula (1) above. R8 preferably independently represents a group selected from methyl groups and phenyl groups, provided that at least 10 mol % of all $R^8$s is a phenyl group.

The organohydrogenpolysiloxane expressed by the average compositional formula (2) above and the organohydrogenpolysiloxane expressed by the average compositional formula (3) may be used independently or in combination.

The amount of the organohydrogenpolysiloxane of component (C) in the curable silicone composition of the present invention is an amount sufficient to cure the curable silicone composition. For the curing reactive functional groups (such as vinyl groups or other alkenyl groups) containing a carbon-carbon double bond in component (A) and component (B), the amount of hydrogen atoms bonded to silicon atoms in the organohydrogenpolysiloxane of component (C) is an amount where the number of hydrogen atoms bonded to silicon atoms per one alkenyl group for alkenyl groups bonded to silicon atoms included in the entire curable silicone composition is 0.5 to 20.0, and particularly preferably within a range of 1.0 to 10.

On the other hand, whatever the structure of these organohydrogenpolysiloxanes, the component preferably does not readily volatilize at approximately 100° C. under atmospheric pressure, particularly at 1 atm (1013.25 hPa). This is because, in the production process of the curable hot-melt silicone sheet or film of the present invention described below, in order to obtain a sheet or film that does not contain a void or the like, it is necessary to melt and mix each component of the curable silicone composition and the composition obtained therefrom in a temperature range of 50 to 150° C. under reduced pressure. Thus, a sheet or film that does not contain a void or the like can be manufactured by using each component of the present invention. Although each component is exposed to a prescribed temperature under reduced pressure for a very short period of time, if a large amount of active component volatilizes under these mixing conditions, there is a problem where a composition with the designed properties cannot be obtained. In particular, the amount of organohydrogenpolysiloxane added as a crosslinking agent is small relative to the total mass of the curable silicone composition. Therefore, volatilization of these components can significantly change the properties of the composition (curing properties, physical properties of the cured product, and the like) from an intended value. Therefore, component (C) must not be readily volatile, and specifically, the mass loss ratio with regard to before exposure after exposure to 100° C. for one hour under atmospheric pressure is 10 mass % or less, which is preferable depending on the application.

(Component (D))

Component (D) is one characteristic component of the curable silicone composition of the present invention, is a hydrosilylation reaction catalyst for curing the curable silicone composition of the present invention by crosslinking the hydrosilylation reactive carbon-carbon double bonds included in components (A) and (B) and the silicon atombonded hydrogen atoms, in other words, the Si—H groups, included in component (C) through a hydrosilylation reaction, and specifically, is a hydrosilylation reaction catalyst that does not exhibit activity unless irradiated with a high energy beam, but exhibits activity in the composition upon irradiation with a high energy beam. Component (D) is a so-called high energy beam activated catalyst or photoactivated catalyst, which is known in the present technical field. By using component (D), the composition as a whole can be cured even at low temperatures triggered by irradiation with a high energy beam, has excellent storage stability, and facilitates reaction control, and thus the properties of excellent handling workability can be achieved.

Examples of high energy beams include ultraviolet rays, gamma rays, X-rays, alpha rays, electron beams, and the like. In particular, examples include ultraviolet rays, X-rays, and electron beams irradiated from a commercially available electron beam irradiating device. Of these, ultraviolet rays are preferable from the perspective of efficiency of catalyst activation, and ultraviolet rays within a wavelength range of 280 to 380 nm are preferable from the perspective of industrial use. Furthermore, the amount of irradiation varies depending on the type of high energy beam activated catalyst, but in the case of ultraviolet rays, the integrated amount of irradiation at a wavelength of 365 nm is preferably within a range of 100 mJ/cm$^2$ to 100 J/cm$^2$.

As specific examples of component (D), (methylcyclopentadienyl) trimethylplatinum (IV) and bis(2,4-pentanedionato) platinum (II) are preferred from the perspective of versatility and ease of availability.

The amount of component (D) is an amount required to further cure the composition, and is preferably an amount in which metal atoms in the catalyst are within a range of 1 to 500 ppm based on mass units, and preferably within a range of 5 to 200 ppm, with regard to the composition.

(Component (E))

In addition to the components (A) to (D) above, the curable silicone composition of the present invention may further contain a curing retarder (E).

The structure of the curing retarder is not particularly limited, but the boiling point thereof is preferably 200° C. or higher under atmospheric pressure. This is because if a compound with a low boiling point is used as a delayed curing agent when melting and mixing raw materials under reduced pressure in a production of the curable silicone composition sheet described below, a portion or all of the curing retarder may volatilize during the melt-kneading process, and thus a targeted cure delaying effect for the curable silicone composition may not be achieved.

The curing retarder of the present invention is not particularly limited, and examples include 2-methyl-3-butin-2-ol, 1-ethynyl-1-cyclohexanol, and other alkyne alcohols; enyne compounds; low molecular weight siloxanes containing an alkenyl group; and methyl-tris(1,1-dimethylpropynyloxy)silane, vinyl-tris(1,1-dimethylpropynyloxy)silane, and other alkynyloxysilanes. Of these, compounds with a boiling point of 200° C. or higher under atmospheric pressure are particularly preferably used.

[Other Additives]

In addition to the component described above, a material conventionally known in the art may be added to the curable hot-melt silicone composition of the present invention as an additive that may be used in a silicone composition, and examples of additives that may be used include, but are not limited to, to those described below.

A filler can be used as an additive to improve the mechanical properties of a cured product obtained from the curable hot-melt silicone composition of the present invention, to improve flame retardancy, or the like. Examples of fillers include inorganic fillers, organic fillers, and mixtures thereof. From the perspective of filler function, one or more fillers selected from reinforcing fillers, thermally conductive fillers, electrically conductive fillers, pigments (particularly, white pigments), phosphors, and the like may be added to the curable hot-melt silicone composition of the present invention. When a filler is used, the type and amount of the filler is preferably selected and used within a range in which the curable hot-melt silicone composition of the present invention can be melt-kneaded and within a range in which the effect on properties (such as curing properties, mechanical properties after curing, weather resistance, and the like) provided by the curable hot-melt silicone composition of the present invention is acceptable. In one preferred aspect of the curable hot-melt silicone composition of the present invention, the curable hot-melt silicone composition does not contain a filler.

The composition of the present invention may contain an adhesion imparting agent as another optional component so long as an object of the present invention is not impaired.

Furthermore, the composition may contain, as other optional components, heat resistance agents such as iron oxide (red iron oxide), cerium oxide, cerium dimethyl silanolate, fatty acid cerium salt, cerium hydroxide, zirconium compound, and the like, with dyes, pigments other than white, flame retardant agents, and the like capable of being contained as long as the purpose of the present invention is not impaired.

The curable hot-melt silicone composition of the present invention may be used in the form of granules, pellets, sheets, films, or the like.

The present composition may be used molded in a sheet or film form. For example, a sheet or film containing the curable silicone composition of the present invention having an average thickness of 10 to 1,000 μm has hot-melt properties and has heat curability under high temperatures. Therefore, the sheet or film has excellent handling workability and melting properties, and is particularly advantageous for use in compression molding or the like. In this case, the composition containing all of components (A) to (D), including component (D), is preferably molded into a sheet or film.

[Laminate Body Containing Curable Hot-Melt Silicone Composition and Use Thereof as Film Adhesive/Sealing Agent]

The present curable hot-melt silicone composition can be used in a sheet or film form, and can be particularly used as a laminate body having a structure in which a sheet-like material containing the curable hot-melt silicone composition described above is interposed between two film-like substrates provided with a release layer. The film-like substrate provided with the release layer (generally referred to as release film) can be released from the sheet-like material containing the curable hot-melt silicone composition when the sheet-like material is used as an adhesive, sealing agent, or the like. The laminate body is also referred to as a releasable laminate body below.

The method of manufacturing the releasable laminate body described above is not particularly limited, and one example includes a method including the following steps:

Step 1: a step of mixing components of the curable hot-melt silicone composition described above;

Step 2: a step of kneading the mixture obtained in step 1 while heating and melting;

Step 3: a step of laminating the mixture after heating and melting in step 2 between two release films provided with at least one release surface, such that the mixture contacts the release surface, to form a laminate body;

Step 4: a step of pressing the laminate body obtained in step 3 between rollers and rolling the mixture interposed between the two release films to form a curable hot-melt silicone composition sheet or film having a specific thickness.

Furthermore, rollers with a cooling or temperature adjusting function may be optionally used in step 4. Furthermore, a step of cutting a resulting laminate body containing the curable hot-melt silicone composition sheet or film may be added after step 4.

Note that the thickness of the release film is not particularly limited, and therefore, in addition to those generally referred to as a film, those referred to as a sheet are also included. However, in the present specification, it is referred to as a release film regardless of the thickness thereof.

[Curable Hot-Melt Silicone Composition Sheet]

The curable hot-melt silicone composition sheet obtained by the manufacturing method of the present invention is a curable silicone composition containing components (A) to (D) and, in some cases, component (E) described above, and has hot-melt properties. The curable hot-melt silicone composition sheet of the present invention can be used as a pressure sensitive adhesive material, sealing agent, and/or adhesive, or the like, having heat-melting properties. In particular, the curable hot-melt silicone composition sheet has excellent moldability, gap filling properties, and pressure sensitive adhesive force, and can be used as a die attach film or film adhesive. Furthermore, the sheet can also be suitably used as a compression molding or press molding curable hot-melt silicone composition sheet.

Specifically, the curable hot-melt silicone composition sheet obtained by the manufacturing method of the present invention may release the release film, and then be disposed at a desired site such as a semiconductor or the like. Subsequently, a film adhesive layer utilizing gap filling properties with regard to protrusions and recesses or gaps may be formed on and between adherends, followed by being temporarily secured, disposed, and applied together between the adherends. Furthermore, the curable hot-melt silicone composition layer can be cured by heating to 150° C. or higher and a cured product of the curable silicone sheet can be formed between the adherends to adhere the adherends. Note that the release film may be released after the curable hot-melt silicone composition sheet is heated to form a cured product, and a timing for releasing the release film from the curable silicone composition or cured product obtained therefrom may be selected based on an application and method of use of the curable silicone composition sheet.

The curable silicone composition sheet has hot-melt properties, and therefore, it is possible to soften or fluidize the sheet by heating the sheet prior to final curing, and for example, thereby forming an adhesive surface with an adherend by filling protrusions and recesses or gaps without a void even if there are irregularities on the adhesive surface of the adherend. Examples of heating means of the curable hot-melt silicone composition sheet that can be used include various thermostatic baths, hot plates, electromagnetic heating devices, heating rollers, and the like. In order to more efficiently adhere the adherend and curable silicone composition sheet together and heat the curable silicone composition, an electric heating press, a diaphragm type laminator, a roll laminator, or the like is preferably used, for example.

[Method of Forming Cured Product]

This curable hot-melt silicone composition can be cured by a method that includes at least the following steps (I) through (III).

(I) a step of heating to a temperature of 100° C. or higher to melt the present composition;

(II) a step of injecting the melted curable hot-melt silicone composition obtained in step (I) above into a mold or a step of distributing the melted curable hot-melt silicone composition obtained in step (I) above to a mold by mold clamping; and (III) a step of curing the curable hot-melt silicone composition injected into a mold in step (II) above.

In the above steps, a transfer molding machine, a compression molding machine, an injection molding machine, an auxiliary ram molding machine, a slide molding machine, a double ram molding machine, a low pressure sealing molding machine, or the like can be used. In particular, the composition of the present invention can be suitably used for the purpose of obtaining a cured product by transfer molding and compression molding. Finally, in step (III), the curable silicone composition injected (applied) into a mold in step (II) is cured. The step can and is preferably performed at a low temperature, as described below.

The curable silicone composition of the present invention can form a cured product by irradiating the composition (or a semi-cured product thereof) of the present invention with a high energy beam such as ultraviolet rays or the like to activate the hydrosilylation catalyst, which is component (D), such that the hydrosilylation reaction in the composition advances. The types of high energy beams are as described above. The amount of irradiation depends on the type of the high energy beam activated catalyst, but in the case of ultraviolet rays, the integrated irradiation amount at 365 nm is preferably within a range of 100 mJ/cm$^2$ to 100 J/cm$^2$, may be within a range of 500 mJ/cm$^2$ to 50 J/cm$^2$, and may be within a range of 500 mJ/cm$^2$ to 20 J/cm$^2$. In other words, the curing reactive silicone composition of the present invention can initiate a curing reaction triggered by irradiation with a high energy beam such as ultraviolet rays or the like. Note that once the hydrosilylation catalyst, which is component (D), is activated, the curing reaction proceeds over time at room temperature or by heating to form a cured product even after irradiation with a high energy beam is stopped.

The curing reaction does not require heating, and therefore curing can be performed at a low temperature (15 to 100° C.), including room temperature (25° C.). Note that in an embodiment of the present invention, "low temperature" refers, for example, to 100° C. or lower, specifically, a temperature range of 15° C. to 100° C., and even temperatures of 80° C. or lower can be selected. When the reaction of the composition (including a semi-cured product) of the present invention proceeds in the temperature range of 15 to 100° C., the present composition may suitably be left at or near room temperature range (a temperature range that can be reached without heating or cooling, particularly including a temperature range of 20 to 25° C.), may be cooled to 15° C. to room temperature, or may be heated to room temperature or higher and 100° C. or lower. Note that the time required for the curing reaction can be designed as appropriate based on the amount of irradiation of a high energy beam such as ultraviolet light or the like and the temperature. Furthermore, depending on process acceptability and necessity, heating above 100° C. may be temporarily performed, or heating and crimping may be performed at the same time to allow the curing reaction to proceed simultaneously with crimping.

On the other hand, the curable hot-melt silicone composition of the present invention can be molded into a thin film-like sheet having a thickness in the range of 100 to 1,000 μm by sandwiching the composition between two release films as described above and molding to a prescribed thickness through two rollers or the like. The thin film-like sheet containing the curable hot-melt silicone composition can be used as a die attach film or a film-like curable silicone adhesive used in manufacturing a semiconductor chip or the like.

[Use of Composition]

The curable hot-melt silicone composition of the present invention has hot-melt properties, excellent workability and curability while melted (hot-melted), and excellent coloring resistance of a resulting cured product obtained by curing the present composition at high temperature. Therefore, the composition is usefully used for sealing materials for light emitting/optical devices, optical reflective materials and other semiconductor members, and optical semiconductors having the cured product. Furthermore, since the cured product has superior mechanical properties, the cured product is suitable as an encapsulant for semiconductors; an encapsulant for power semiconductors such as SiC, GaN, or the like; an adhesive, potting agent, protective agent, and coating agent for electrical and electronic applications. The curable hot-melt silicone composition of the present invention in sheet form is also suitable as a material for sealing and adhering large-area substrates using press molding, compression molding, a vacuum laminator, or the like. In particular, the composition is preferably used as an encapsulant for semiconductors using an overmold molding method at the time of molding. Furthermore, a sheet of this composition can be used as a curable film adhesive or as a buffer layer for stress between two substrates with different coefficients of linear expansion.

In addition, the curable hot-melt silicone composition of the present invention, and particularly the curable hot-melt silicone composition in sheet form, can be used for large-area sealing of semiconductor substrates (including wafers). Furthermore, a sheet formed from the curable hot-melt silicone composition of the present invention can be used for die attach films, sealing a flexible device, stress relief layers for bonding two different base materials, and the like. In other words, the curable silicone composition of the present invention may be a sealing agent for single-sided sealing or for double-sided sealing along with adhesion between two base materials, and have preferred properties suitable for these applications.

[Use of Cured Product]

An application of the cured product obtained by curing the curable silicone composition of the present invention is not particularly limited. The composition of the present invention has hot-melt properties, excellent curability even at low temperatures triggered by irradiation with a high energy beam, and excellent moldability and mechanical properties, and a cured product is relatively hard with little surface tack. Therefore, the cured product obtained by curing the present composition can be suitably used as a member for a semiconductor device, and can be suitably used as an encapsulant for a semiconductor element, an IC chip or the like, and as an adhesive/bonding member of a conductor device.

Although a semiconductor device provided with a member containing a cured product obtained by curing the curable silicone composition of the present invention is not particularly limited, the composition of the present invention forms an optically transparent cured product, and thus is particularly preferably used in applications that require light transmission. For example, it is preferably a light-emitting semiconductor device, which is light-emitting/optical device, optical member for a display, a solar panel member, and particularly a sealing material or adhesive member used in these devices and the like. Furthermore, the cured product of the present invention has excellent coloring resistance at high temperatures, and therefore is more preferably used as a sealing material or adhesive member used in electronic materials where transparency and light/heat resistance are important.

EMBODIMENTS

The curable silicone composition of the present invention and manufacturing method thereof are described below in detail using Embodiments and comparative examples. Note that in the following description, Me, Vi, and Ph in the average unit formula represent methyl, vinyl, and phenyl groups, respectively. Furthermore, the softening point, curability, and storage stability of the of the curable silicone compositions of each Embodiment and comparative example were measured by the following methods. The results are shown in Table 1.

[Softening Point]

The curable silicone composition was molded into cylindrical pellets of φ14 mm×22 mm. The pellet was placed on a hot plate set at 25° C. to 100° C. and kept pressed from above for 10 seconds with a load of 100 grams, and after the load was removed, the amount of deformation of the pellet was measured. The temperature at which the deformation amount in the height direction was 1 mm or more was defined as the softening point.

[Curing Properties]

The curable silicone composition was vulcanized for 600 seconds at the molding temperature (160° C.) using a curastometer (PREMIER MDR manufactured by Alpha Technologies) in accordance with a method specified in JIS K 6300-2:2001, "Unvulcanized Rubber—Physical Properties—Part 2: Determination of Vulcanization Characteristics Using a Vibratory Vulcanization Tester" to measure the curing properties. Note that for the measurement, a lump of the curable hot-melt silicone composition was weighed out at approximately 5 g, sandwiched between 50 μm-thick PET films, and then placed on a lower die, and measurement started when the upper die closed. The measurements were made using an R-type die for rubber, with an amplitude angle of 0.53°, a vibration frequency of 100 times/minute, and a maximum torque range of 230 kgf-cm. As a result of the measurement, the time (ts-1) required to exceed a torque value of 1 dNm was read in units of seconds.

[Storage Stability]

The curable silicone composition was aged in an oven at 40° C. for one week. The curing properties were then measured using the method described above, and the is-1 value was read.

Mixtures having the hot-melt properties of organopolysiloxane resin and straight-chain organopolysiloxane were prepared by the methods indicated in Reference Examples 1 to 7 below, and the storage stability and curability at 100° C. were evaluated. Note that the low molecular weight organopolysiloxane component that is removed by the following method include an $M_4Q$ structure and the like.

REFERENCE EXAMPLE 1

2.40 kg of an organopolysiloxane resin a1 that is a white solid at 25° C., expressed by the average unit formula:

$$(Me_2ViSiO_{1/2})_{0.05}(Me_3SiO_{1/2})_{0.39}(SiO_{4/2})_{0.56}(HO_{1/2})_{0.02}$$

(amount of vinyl group=1.9 mass %), 4.46 kg of an organopolysiloxane resin a2 that is a white solid at 25° C., expressed by the average unit formula:

$$(Me_3SiO_{1/2})_{0.44}(SiO_{4/2})_{0.56}(HO_{1/2})_{0.02}$$

(amount of vinyl group=0 mass %), and 2.69 kg of dimethylpolysiloxane capped at both molecular terminals with dimethylvinylsiloxy groups b, expressed by the formula: $ViMe_2SiO(Me_2SiO)_{800}SiViMe_2$ (amount of vinyl group=0.09 mass %) were dissolved in 4.00 kg of xylene in a pail using a three-one motor.

The resulting solution was fed into a twin-screw extruder with the maximum attainable temperature set at 230° C. The xylene and low molecular weight organopolysiloxane components were removed under a vacuum of −0.08 MPa, resulting in a hot-melt transparent mixture 1. The mixture 1 was placed in a pail and cooled to a solid state. The amount of volatile components in this mixture based on conditions of 200° C. for 1 hour were measured and was 0.7 mass %.

REFERENCE EXAMPLE 2 to 7

Transparent hot-melt mixtures 2 to 7 were obtained in the same manner as Reference Example 1, except that the amounts used in Reference Example 1 of the organopolysiloxane resin a1, organopolysiloxane resin a2, dimethylpolysiloxane capped at both molecular terminals with dimethylvinylsiloxy groups b, and xylene were changed to the amounts shown in Table 1 below. The amount of volatile components in the mixtures based on conditions of 200° C. for 1 hour were measured and were 0.7 mass %.

Embodiment 1

The resulting hot-melt mixture 1 obtained in Reference Example 1 was fed into a twin-screw extruder at 170° C. by a hot-melter (VersaPail Melter manufactured by Nordson) for cylindrical pails at 9.55 kg/hr from a line 1 as illustrated in FIG. 1.

Next, a mixture, containing organohydrogenpolysiloxane expressed by the formula:

$$(PhSiO_{3/2})_{0.4}(HMe_2SiO_{1/2})_{0.6}$$

(amount of volatile components when aged in a 100° C. oven under atmospheric pressure for one hour, in other words, the mass loss ratio was 3.4 mass %) at a rate of 0.30 kg/hr, and methyltris-1,1-dimethyl-2-propynyloxysilane (boiling point=245° C. (1012.35 hPa)) at an amount of 300 ppm relative to the entire composition, was fed from line 3-a as illustrated in FIG. 1.

The set temperature of the feed section was 150° C.

Then, a mixture, containing the dimethylpolysiloxane capped at both molecular terminals with dimethylvinylsiloxy groups (amount of vinyl groups=0.09 mass %) expressed by $$ViMe_2SiO(Me_2SiO)_{800}SiViMe_2$$

at a rate of 0.15 kg/hr, and (methylcyclopentadienyl) trimethylplatinum (IV) (at an amount of 6.0 ppm based on mass units as platinum metal relative to the entire present composition), was fed from line 3-b in FIG. 1 (set temperature of introducing part was 80° C.), and degassing melt-kneading was performed with the degree of vacuum in an extruder of −0.08 MPa.

The outlet temperature of the twin-screw extruder was set at 80° C. The mixture was in the form of semi-solid softened material. While transporting 330 mm wide and 125-μm-thick release films (FL2-01 manufactured by TAKARA INC. CO. Ltd.) at a rate of 1.0 m/min, the mixture was supplied onto a release film such that the feed rate was 5 kg/hr. The mixture was then interposed between two release films such that a release surface of the release film was in contact with the mixture to form a laminate body (the same applies in the following examples). Subsequently, the laminate body was then pressed between rollers with temperatures controlled at 90° C. to stretch the mixture between the release films to form a laminate body in which a curable hot-melt silicone composition sheet having a thickness of 300 μm was interposed between the two release films. The entire laminate body was then cooled by air cooling. The configuration of the manufacturing device is illustrated in FIG. 1. When the release film was released from the obtained laminate body,

TABLE 1

| Amount of each component used (kg) | Reference Example No. | | | | | | |
|---|---|---|---|---|---|---|---|
| | 1 | 2 | 3 | 4 | 5 | 6 | 7 |
| Organopolysiloxane resin a1 (amount of vinyl groups = 1.9 mass %) | 2.40 | 3.09 | 3.76 | 4.44 | 5.15 | 0.70 | 1.00 |
| Organopolysiloxane resin a2 (amount of vinyl groups = 0 mass %) | 4.46 | 3.77 | 3.08 | 2.39 | 1.72 | 6.30 | 6.00 |
| Dimethylpolysiloxane capped at both molecular terminals with dimethylvinylsiloxy groups b (amount of vinyl groups: 0.09 mass %) | 2.69 | 2.69 | 2.50 | 2.49 | 2.37 | 2.85 | 2.53 |
| Xylene | 4.0 | 4.0 | 4.0 | 4.0 | 4.0 | 4.0 | 4.0 |
| Mixture No. (Amount of volatile components = 0.7 mass %) | 1 | 2 | 3 | 4 | 5 | 6 | 7 | a flat, homogeneous, tack-free, transparent curable hot-melt silicone composition sheet without bubbles was obtained, and the softening temperature thereof was 85° C. The resulting curable hot-melt silicone composition sheet was irradiated with ultraviolet light with a 365 nm wavelength at an irradiation dose of 10 J/cm², and then the curability at 100° C. was measured by the method described above. The is-1 thereof was 59 seconds. The curable hot-melt silicone composition sheet was aged in an oven at 40° C. for one week, then irradiated with ultraviolet light as described above. The curability at 100° C. was again measured, and the ts-1 thereof was 61 seconds. The resulting curable hot-melt silicone composition sheet was irradiated with ultraviolet light as described above and thermally cured at 100° C. for one hour by heat pressing. A PET film was placed on the resulting cured product and a load of 0.5 kg/cm2 was applied. No adhesion was observed between the cured product and the PET film.

Embodiments 2 to 7 and Comparative Examples 1 to 4

A foam-free, flat, homogeneous, tack-free, transparent curable hot-melt silicone composition sheet and a releasable laminate body containing the sheet were obtained in the same manner as in Embodiment 1, except that the type of mixture, type and introduced amounts (feed, concentration, and the like) of the organohydrogenpolysiloxane, curing retarder, dimethylpolysiloxane capped at both molecular terminals with dimethylvinylsiloxy groups b, and hydrosilylation reaction catalyst were changed as in Table 2 (Embodiments) and Table 3 ((Comparative Examples). The following table shows the results of evaluating the softening temperature of the curable hot-melt silicone composition sheets according to the Embodiments, the curability (ts-1) immediately after manufacture and after aging (40° C. for one week), and whether or not cured products obtained by heat pressing after irradiating with ultraviolet light adheres to a PET film.

TABLE 2

| Embodiment No. | 1 | 2 | 3 | 4 | 5 | 6 | 7 |
|---|---|---|---|---|---|---|---|
| Mixture No. | 1 | 2 | 3 | 3 | 3 | 4 | 5 |
| Mixture feed (kg/hr) | 9.55 | 9.56 | 9.34 | 9.33 | 9.33 | 9.32 | 9.24 |
| Type of organohydrogenpolysiloxane expressed by the following formula and feed thereof (kg/hr) | | | | | | | |
| $(PhSiO_{3/2})_{0.4}(HMe_2SiO_{1/2})_{0.6}$ (Mass loss ratio: 3.4 mass %) | 0.30 | | 0.45 | | | 0.530 | 0.610 |
| $(HMe_2SiO_{1/2})_{0.52}(Me_2SiO_{2/2})_{0.15}(SiO_{4/2})_{0.33}$ (Mass loss ratio: 2.9 mass %) | | 0.295 | | 0.360 | 0.520 | | |
| Type of curing retarder and concentration thereof in entire composition | | | | | | | |
| Methyltris-1,1-dimethyl-2-propynyloxysilane (boiling point = 245° C. (1012.35 hPa)) ppm | 300 ppm | 400 ppm | 500 ppm | 600 ppm | 200 ppm | 500 ppm | 500 ppm |
| Feed of dimethylpolysiloxane capped at both molecular terminals with dimethylvinylsiloxy groups b (amount of vinyl groups: 0.09 mass %) (kg/hr) | 0.15 | 0.15 | 0.21 | 0.31 | 0.15 | 0.15 | 0.15 |
| (Methylcyclopentadienyl) trimethylplatinum (IV) (concentration in ppm as platinum metal based on mass units for entire composition) | 6.0 ppm | 8.0 ppm | 10.0 ppm | 12.0 ppm | 10.0 ppm | 10.0 ppm | 10.0 ppm |
| Properties of curable hot-melt silicone composition sheet | | | | | | | |
| Softening temperature (° C.) | 85° C. | 85° C. | 80° C. | 80° C. | 80° C. | 80° C. | 75° C. |
| Curability after UV irradiation at 100° C. (immediately after manufacture) ts −1 (seconds) | 59 seconds | 68 seconds | 61 seconds | 53 seconds | 73 seconds | 54 seconds | 50 seconds |

TABLE 2-continued

| Embodiment No. | 1 | 2 | 3 | 4 | 5 | 6 | 7 |
|---|---|---|---|---|---|---|---|
| Curability after UV irradiation at 100° C. (40° C. for 1 week) ts −1 (seconds) | 61 seconds | 66 seconds | 60 seconds | 54 seconds | 71 seconds | 54 seconds | 50 seconds |
| No adhesion to PET | Absent | Absent | Absent | Absent | Absent | Absent | Absent |

TABLE 3

| Comparative Example No. | 1 | 2 | 3 | 4 |
|---|---|---|---|---|
| Mixture No. | 6 | 7 | 3 | 3 |
| Mixture feed (kg/hr) | 9.85 | 9.53 | 9.34 | 9.40 |
| Type of organohydrogenpolysiloxane expressed by the following formula and feed thereof (kg/hr) | | | | |
| $Me_3SiO(Me_2SiO)_{37}(MeHSiO)_{37}SiMe_3$ (Mass loss ratio: 2.6 mass %) | 0.120 | 0.068 | | |
| $HMe_2SiO(Me_2SiO)_{17}SiMe_2H$ (Mass loss ratio: 8.3 mass %) | | 0.253 | | |
| $(PhSiO_{3/2})_{0.4}(HMe_2SiO_{1/2})_{0.6}$ (Mass loss ratio: 3.4 mass %) | | | 0.45 | 0.45 |
| Type of curing retarder and concentration thereof in entire composition | | | | |
| Methyltris-1,1-dimethyl-2-propynyloxysilane (boiling point = 245° C. (1012.35 hPa)) ppm | 200 ppm | — | 3500 ppm | 1500 ppm |
| Feed of dimethylpolysiloxane capped at both molecular terminals with dimethylvinylsiloxy groups b (amount of vinyl groups: 0.09 mass %) (kg/hr) | 0.15 | 0.15 | 0.21 | 0.21 |
| (Methylcyclopentadienyl) trimethylplatinum (IV) (concentration in ppm as platinum metal based on mass units for entire composition) | 10.0 ppm | 14.4 ppm | — | — |
| a 1,3-divinyl-tetramethyldisiloxane solution of an 1,3-divinyl-tetramethyldisiloxane platinum complex (concentration in ppm as platinum metal based on mass units relative to the entire composition) | | | 4.0 ppm | 4.0 Ppm |
| Properties of curable hot-melt silicone composition sheet | | | | |
| Softening temperature (° C.) | 80° C. | 85° C. | 80° C. | 80° C. |
| Curability after UV irradiation at 100° C. (immediately after manufacture) ts-1 (seconds) | 73 seconds | 3 seconds | —(**) | 144 seconds |
| Curability after UV irradiation at 100° C. (40° C. for 1 week) ts-1 (seconds) | 80 seconds | No melting | —(**) | 10 seconds |
| No adhesion to PET | Present (*) | Present (*) | Absent | Absent |

(*) When a PET film was placed on the resulting cured product and a load of 0.5 kg/cm² was applied, adhesion was observed between the cured product and the PET film, and tearing was observed on the cured product when the film was peeled off.
(**) ts-1 was not observed even after 60 minutes had passed.

[Summary]

The curable silicone compositions of Embodiments 1 to 7 of the present invention use a specific solid organopolysiloxane resin and chain organopolysiloxane, as well as a photoactivated hydrosilylation catalyst, and thus curing is possible at approximately 100° C., triggered by ultraviolet light irradiation, without impairing storage stability. Furthermore, the resulting silicone cured product has very low surface tackiness, and therefore is expected to be suitable for use in protecting semiconductor devices and the like.

On the other hand, the cured products containing the curable silicone compositions of Comparative Examples 1 and 2, which are photoactivated hydrosilylation catalyzed, have a high surface tackiness and stickiness. Thus, when used to seal semiconductor devices and the like or when coming into close contact with another base material, stickiness and adhesiveness due to the high tackiness are exhibited, which is expected to cause problems such as the occurrence of unsuitable applications. On the other hand, in Comparative Examples 3 and 4, which do not use the photoactivated hydrosilylation catalyst proposed by the present invention, it was not possible to provide a cured silicone composition that can be thermally cured at a low temperature of approximately 100° C. without impairing storage stability. Thus, favorable curability at low temperatures, which is an object of the present invention, could not be achieved.

REFERENCE NUMERALS

1: Hot-melter
2: Extruder
3-$a$: Pump
3-$b$: Pump
3-$c$: Vacuum pump
4-$a$: Release sheet
4-$b$: Release sheet
5-$a$: Stretching roller (optionally further equipped with a temperature control function)
5-$b$: Stretching roller (optionally further equipped with a temperature control function)
6: Cooling roller
7: Film thickness meter
8: Sheet cutter
9: Foreign material inspecting machine

The invention claimed is:

1. A curable silicone composition having hot-melt properties as a whole composition, comprising:
  (A) 100 mass parts of an organopolysiloxane resin containing the following component (A1) and component (A2) at a mass ratio of 20:80 to 90:10;
  (A1) an organopolysiloxane resin that is solid at 25° C., having a curing reactive functional group containing a carbon-carbon double bond in a molecule, containing a siloxane unit expressed by $SiO_{4/2}$ making up at least 20 mol % of all siloxane units, and does not independently have hot-melt properties, and
  (A2) an organopolysiloxane resin that is solid at 25° C., not having a curing reactive functional group containing a carbon-carbon double bond in a molecule, containing a siloxane unit expressed by $SiO_{4/2}$ making up at least 20 mol % of all siloxane units, and does not independently have hot-melt properties;
  (B) 10 to 100 mass parts of a straight-chain or branched organopolysiloxane that is liquid or has plasticity at 25° C., having a curing reactive functional group containing at least two carbon-carbon double bonds in a molecule;
  (C) an organohydrogenpolysiloxane resin having at least two silicon-bonded hydrogen atoms in a molecule, present in an amount where the number of hydrogen atoms bonded to a silicon atom per one alkenyl group bonded to a silicon atom included in the entire composition is 0.5 to 20.0; and
  (D) a hydrosilylation reaction catalyst that does not exhibit activity without irradiating with a high energy beam, but exhibits activity in the composition when a high energy beam is irradiated at an amount sufficient for curing the composition;
    wherein component (A) has a mass loss ratio of 2.0 mass % or less when exposed to 200° C. for one hour; and
    wherein component (C) is expressed by the following average compositional formula (2):

$$(HR^6{}_2SiO_{1/2})_e(R^6{}_2SiO_{2/2})_f(SiO_{4/2})_g \quad (2)$$

where $R^6$ independently represents an unsubstituted or substituted monovalent hydrocarbon group that does not contain an aliphatic unsaturated bond with 1 to 12 carbon atoms, and e, f, and g represent numbers that satisfy conditions of $0.01 \leq e \leq 0.6$, $0 \leq f \leq 0.9$, $0.2 \leq g \leq 0.9$, and e+f+g=1; or
wherein component (C) is expressed by the following average compositional formula (3):

$$(HR^7{}_2SiO^{1/2})_h(R7_2SiO_{2/2})_i(R^8SiO_{3/2})_j \quad (3)$$

where $R^7$ and $R^8$ each independently represent an unsubstituted or substituted monovalent hydrocarbon group that does not contain an aliphatic unsaturated bond with 1 to 12 carbon atoms, at least 10 mol % of all Ros represent aryl groups, and h, 1, and j represent numbers that satisfy conditions of $0.01 \leq h \leq 0.6$, $0 \leq i \leq 0.9$, $0.2 \leq j \leq 0.9$, and h+i+j=1.

2. The curable silicone composition according to claim 1, further comprising:
  (E) 1 to 5000 ppm of a curing retarder for a hydrosilylation reaction having a boiling point of 200° C. or higher at atmospheric pressure, based on the total mass of the composition.

3. The curable silicone composition according to claim 1, wherein component (A1) is (A1-1) an organopolysiloxane resin that does not have hot-melt properties alone, expressed by the following average unit formula:

$$(R^1{}_3SiO_{1/2})_a(R^1{}_2SiO_{2/2})_b(R^1SiO_{3/2})_c(SiO_{4/2})_d (R^2O_{1/2})_e$$

where each $R^1$ independently represents a monovalent hydrocarbon group with 1 to 10 carbon atoms, but 1 to 12 mol % of all $R^1$s in a molecule represents an alkenyl group; each $R^2$ represents a hydrogen atom or an alkyl group with 1 to 10 carbon atoms; and "a", "b", "c", "d", and "e" represent numbers that satisfy $0.10 \leq a \leq 0.60$, $0 \leq b \leq 0.70$, $0 \leq c \leq 0.80$, $0 \leq d \leq 0.65$, $0 \leq e \leq 0.05$, but (c+d) >0.20 and (a+b+c+d)=1;
component (A2) is (A2-1) an organopolysiloxane resin that does not have hot-melt properties alone, expressed by the following average unit formula:

$$(R^3{}_3SiO_{1/2})_f(R^3{}_2SiO_{2/2})_g(R^3SiO_{3/2})_h(SiO_{4/2})_i(R^2O_{1/2})_j$$

where each $R^3$ independently represents a monovalent hydrocarbon group with 1 to 10 carbon atoms and does not contain a carbon-carbon double bond; $R^2$ represents a hydrogen atom with an alkyl group with 1 to 10 carbon atoms; and "f", "g", "h", "I", and "j" represents numbers that satisfy $0.35 \leq f \leq 0.55$, $0 \leq g \leq 0.20$, $0 \leq h \leq 0.20$, $0.45 \leq i \leq 0.65$, $0 \leq j \leq 0.05$, and (f+g+h+i)=1; and
component (B) is (B1) a straight-chain diorganopolysiloxane expressed by the following structural formula:

$$R^4{}_3SiO(SiR^4{}_2O)_kSiR^4{}_3$$

where each $R^4$ independently represents a monovalent hydrocarbon group with 1 to 10 carbon atoms, but at least two of the $R^4$s in one molecule represents an alkenyl group, and k represents a number from 20 to 5,000.

4. A curable silicone composition sheet or film formed from the curable silicone composition according to claim 1, which is melt-kneaded under vacuum within a temperature range of 50 to 150° C. and then molded into a sheet or film.

5. The curable silicone composition sheet or film according to claim 4, wherein the thickness is between 10 and 1000 μm.

6. A releasable laminate body, comprising:

the curable silicone composition sheet or film according to claim 4; and a sheet or film-like base material adhered to one or two surfaces of the curable silicone composition sheet or film, and having a release surface facing the curable silicone composition sheet or film; wherein the curable silicone composition sheet or film can be released from the sheet or film-like base material having the release surface.

7. A laminate body, comprising:

a base material serving as an electronic component or a precursor thereof; and a curable silicone composition layer formed with at least one surface of the curable silicone composition sheet or film according to claim 4 firmly adhered to a portion or all of a front surface of the base material; wherein the curable silicone composition is in an uncured state.

8. A cured product obtained by irradiating the curable silicone composition according to claim 1 with a high energy beam and then curing.

9. A method of manufacturing the laminate body according to claim 7, comprising a step of firmly adhering at least one surface of an uncured curable silicone composition sheet or film to a portion or all of a base material serving as an electronic component or a precursor thereof, by one or more means selected from vacuum laminators, vacuum presses, and compression molding.

10. A method of manufacturing a laminate body including a cured silicone composition layer, comprising a step of irradiating the laminate body according to claim 7 with a high energy beam and then heating to cure the uncured curable silicone composition.

11. A method of manufacturing a laminate body including a cured silicone composition, comprising a step of irradiating the curable silicone composition sheet or film according to claim 4 with a high energy beam, then adhering at least one surface of the uncured curable silicone composition sheet or film to a portion or all of a base material serving as an electronic component or precursor thereof by one or more means selected from vacuum laminators, vacuum presses, and compression molding, and forming a laminate body while curing the silicone composition film or sheet by heating.

12. The curable silicone composition according to claim 3, further comprising:

(E) 1 to 5000 ppm of a curing retarder for a hydrosilylation reaction having a boiling point of 200° C. or higher at atmospheric pressure, based on the total mass of the composition.

13. The curable silicone composition according to claim 1, wherein component (A1) is (A1-1) an organopolysiloxane resin that does not have hot-melt properties alone, expressed by the following average unit formula:

$$(R^1_3SiO_{1/2})_a(R^1_2SiO_{2/2})_b(R^1SiO_{3/2})_c(SiO_{4/2})_d (R^2O_{1/2})_e$$

where each $R^1$ independently represents a monovalent hydrocarbon group with 1 to 10 carbon atoms, but 1 to 12 mol % of all R's in a molecule represents an alkenyl group; each $R^2$ represents a hydrogen atom or an alkyl group with 1 to 10 carbon atoms; and "a", "b", "c", "d", and "e" represent numbers that satisfy $0.10 \le a \le 0.60$, $0 \le b \le 0.70, 0 \le c \le 0.80, 0 \le d \le 0.65, 0 \le e \le 0.05$, but (c+d) $\le 0.20$ and (a+b+c+d)=1.

14. The curable silicone composition according to claim 1, wherein component (A2) is (A2-1) an organopolysiloxane resin that does not have hot-melt properties alone, expressed by the following average unit formula:

$$(R^3_3SiO_{1/2})_f(R^3_2SiO_{2/2})_g(R^3SiO_{3/2})_h(SiO_{4/2})_i(R^2O_{1/2})_j$$

where each $R^3$ independently represents a monovalent hydrocarbon group with 1 to 10 carbon atoms and does not contain a carbon-carbon double bond; $R^2$ represents a hydrogen atom with an alkyl group with 1 to 10 carbon atoms; and "f", "g", "h", "I", and "j" represents numbers that satisfy $0.35 \le f \le 0.55, 0 \le g \le 0.20, 0 \le h \le 0.20, 0.45 \le i \le 0.65, 0 \le j \le 0.05$, and (f+g+h+i)=1.

15. The curable silicone composition according to claim 1, wherein component (B) is (B1) a straight-chain diorganopolysiloxane expressed by the following structural formula:

$$R^4_3SiO(SiR^4_2O)_kSiR^4_3$$

where each $R^4$ independently represents a monovalent hydrocarbon group with 1 to 10 carbon atoms, but at least two of the Ras in one molecule represents an alkenyl group, and k represents a number from 20 to 5,000.

16. The curable silicone composition according to claim 1, wherein the composition has a softening point of between 5° and 200° C. and a melt viscosity of less than 1000 Pa·s at 150° C.

17. The curable silicone composition according to claim 1, wherein component (C) is expressed by the average compositional formula (2).

18. The curable silicone composition according to claim 1, wherein component (C) is expressed by the average compositional formula (3).

* * * * *